US010249517B2

(12) United States Patent
Iwao et al.

(10) Patent No.: US 10,249,517 B2
(45) Date of Patent: Apr. 2, 2019

(54) SUBSTRATE PROCESSING APPARATUS

(71) Applicant: SCREEN Holdings Co., Ltd., Kyoto (JP)

(72) Inventors: Michinori Iwao, Kyoto (JP); Ryo Muramoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 473 days.

(21) Appl. No.: 15/172,613

(22) Filed: Jun. 3, 2016

(65) Prior Publication Data

US 2016/0365260 A1      Dec. 15, 2016

(30) Foreign Application Priority Data

Jun. 15, 2015 (JP) .............................. P2015-120297
Jun. 15, 2015 (JP) .............................. P2015-120298

(51) Int. Cl.
*B08B 7/04* (2006.01)
*H01L 21/67* (2006.01)

(52) U.S. Cl.
CPC .... *H01L 21/6708* (2013.01); *H01L 21/67051* (2013.01)

(58) Field of Classification Search
CPC . H01L 21/6708; H01L 21/67051; B08B 7/04; B08B 3/02; B08B 5/02
See application file for complete search history.

(56) References Cited

U.S. PATENT DOCUMENTS

| 6,446,643 | B2 | 9/2002 | Curtis et al. | 134/25.4 |
|---|---|---|---|---|
| 7,429,537 | B2 | 9/2008 | Aegerter et al. | 438/745 |
| 2003/0047199 | A1 | 3/2003 | Worm | 134/33 |
| 2004/0065354 | A1 | 4/2004 | Ishizaki et al. | 134/30 |
| 2004/0084144 | A1 | 5/2004 | Yokouchi et al. | 156/345.11 |
| 2005/0039779 | A1* | 2/2005 | Ohtsuka | B08B 3/02 134/30 |
| 2009/0084409 | A1 | 4/2009 | Okura et al. | 134/21 |
| 2010/0109263 | A1 | 5/2010 | Jun et al. | 279/128 |
| 2012/0064256 | A1 | 3/2012 | Higashijima et al. | 427/532 |
| 2012/0162628 | A1 | 6/2012 | Van Der Blij et al. | 355/72 |

(Continued)

FOREIGN PATENT DOCUMENTS

| CN | 103681237 A | 3/2014 |
|---|---|---|
| JP | H11-102882 A | 4/1999 |

(Continued)

*Primary Examiner* — Robert M Kunemund
(74) *Attorney, Agent, or Firm* — Ostrolenk Faber LLP

(57) ABSTRACT

A substrate processing apparatus has a labyrinth around a processing liquid nozzle above a nozzle gap, and a seal gas is supplied to the labyrinth to seal the nozzle gap from an external space. Consequently, the entry of the atmosphere of the external space into a processing space through the nozzle gap can be suppressed. An opposing-member flange part of a top plate has a first uneven part on the upper surface, and a holder body of an opposing-member moving mechanism has a second uneven part on the lower surface. The labyrinth is formed by raised portions of one of the first and second uneven parts being disposed within recessed portions of the other of the first and second uneven parts with a gap therebetween only when the top plate is located at a second position (i.e., the processing space is created). This achieves flattening of the substrate processing apparatus.

15 Claims, 13 Drawing Sheets

(56) References Cited

U.S. PATENT DOCUMENTS

| | | | |
|---|---|---|---|
| 2012/0273011 A1* | 11/2012 | Osada | H01L 21/67051 |
| | | | 134/33 |
| 2014/0060423 A1 | 3/2014 | Nakai et al. | 118/50 |
| 2014/0273498 A1 | 9/2014 | Kobayashi et al. | 438/745 |
| 2014/0290703 A1 | 10/2014 | Kobayashi et al. | 134/33 |

FOREIGN PATENT DOCUMENTS

| | | |
|---|---|---|
| JP | 2002-177909 | 6/2002 |
| JP | 2004-079909 A | 3/2004 |
| JP | 2004-134431 A | 4/2004 |
| JP | 3621568 | 2/2005 |
| JP | 2006-128424 A | 5/2006 |
| JP | 2007-088398 A | 4/2007 |
| JP | 4054248 | 2/2008 |
| JP | 2008-153692 | 7/2008 |
| JP | 4455880 | 4/2010 |
| JP | 2011-135014 | 7/2011 |
| JP | 2012-015506 A | 1/2012 |
| JP | 2013-102238 A | 5/2013 |
| JP | 2014-030045 | 2/2014 |
| JP | 2014-179490 A | 9/2014 |
| JP | 2014-194965 A | 10/2014 |
| TW | 200403708 A | 3/2004 |
| TW | 201218299 A1 | 5/2012 |

* cited by examiner

SUBSTRATE PROCESSING APPARATUS

TECHNICAL FIELD

The present invention relates to a substrate processing apparatus for processing substrates.

BACKGROUND ART

A process of manufacturing semiconductor substrates (hereinafter, simply referred to as "substrates") conventionally involves various types of processing that is performed on substrates. For example, chemical solution processing such as etching is performed on a surface of a substrate having a resist pattern on its surface by supplying a chemical solution to the substrate. After the chemical solution processing ends, cleaning processing is performed by supplying a cleaning liquid to the substrate, and then dry processing is performed on the substrate.

In a substrate cleaning device disclosed in Japanese Patent Publication No. 3621568 (Document 1), a cover member is placed on a spin chuck that holds a wafer horizontally, and rotated along with the wafer. When performing cleaning processing on the substrate, first a cleaning liquid is supplied from an upper nozzle disposed above and spaced from the cover member to the substrate that is being rotated, through an opening provided in the cover member at the center of rotation. Examples of cleaning liquids that are used include hydrofluoric acid, hydrochloric acid, sulfuric acid, phosphoric acid, ammonia, and a hydrogen peroxide solution. Then, deionized water is supplied from the upper nozzle to the rotating substrate to wash away the cleaning liquid adhering to the substrate. When subsequently performing dry processing on the substrate, a nitrogen ($N_2$) gas is ejected from the upper nozzle and supplied to the wafer through the opening of the cover member. This reduces the oxygen concentration in the space between the cover member and the wafer and accelerates drying of the substrate.

Similarly, in a substrate periphery processing apparatus disclosed in Japanese Patent Application Laid-Open No. 2014.30045 (Document 2), a barrier plate is placed on a spin chuck that holds a wafer horizontally, and rotated along with the wafer. The barrier plate has a through hole in the center, and a flange pipe having an internal space communicating with the through hole is coupled to the upper surface of the barrier plate. A barrier plate flange having a through hole in the center is coupled to the upper end of the flange pipe. When the barrier plate is retracted from above the spin chuck, a barrier-plate hand moves upward to hold the barrier plate flange from below and further moves upward to separate the barrier plate above the spin chuck.

In the internal space of the flange pipe, a central-axis nozzle is disposed without being in contact with the flange pipe. When the wafer is processed, a process gas such as a nitrogen gas is supplied through the central-axis nozzle to the space between the barrier plate and the wafer. A barrier-side labyrinth member is fixed to the upper surface of the barrier plate flange, and above the barrier-side labyrinth member, a nozzle-side labyrinth member is disposed without being in contact with the barrier-side labyrinth member. The nozzle-side labyrinth member is fixed to a nozzle holder that holds the central-axis nozzle, and moves up and down along with the central-axis nozzle and the nozzle holder. A seal gas such as dry air is supplied to the space between the nozzle-side labyrinth member and the barrier-side labyrinth member.

In the substrate cleaning device of Document 1, the atmosphere outside the space between the cover member and the wafer may enter the space from the opening of the cover member. On the other hand, in the substrate periphery processing apparatus of Document 2, the seal gas supplied to the space between the barrier-side labyrinth member and the nozzle-side labyrinth member suppresses the entry of the atmosphere outside the space between the barrier plate and the wafer into the space from the through hole of the barrier plate. However, the configuration in which the barrier-side labyrinth member is fixed to the upper surface of the barrier plate flange and the nozzle-side labyrinth member is disposed above the barrier-side labyrinth member increases the size of the substrate periphery processing apparatus in the up-down direction. Moreover, if the pressure in the space between the barrier plate and the wafer varies and becomes lower than the external pressure, the sealing between the labyrinths may be broken and the external atmosphere may enter the space.

SUMMARY OF INVENTION

The present invention is intended for a substrate processing apparatus for processing a substrate, and it is an object of the present invention to achieve flattening of the substrate processing apparatus. The present invention also aims to suitably suppress the entry of the atmosphere from the external space.

A substrate processing apparatus according to the present invention includes a substrate holder for holding a substrate in a horizontal position, an opposing member that opposes an upper surface of the substrate and has an opposing-member opening in a central part, an opposing-member moving mechanism for holding the opposing member and moving the opposing member relative to the substrate holder in an up-down direction between a first position and a second position that is below the first position, a substrate rotation mechanism for rotating the substrate along with the substrate holder about a central axis pointing in the up-down direction, a processing liquid nozzle for supplying a processing liquid to the upper surface of the substrate through the opposing-member opening, and a gas supply part for supplying a treatment atmospheric gas to a space between the opposing member and the substrate. The opposing member includes an opposing-member body that opposes the upper surface of the substrate and has the opposing-member opening in the central part, an opposing-member tubular part that has a tubular shape and protrudes upward from a periphery of the opposing-member opening of the opposing-member body and in which the processing liquid nozzle is inserted, an opposing-member flange part that annularly extends radially outward from an upper end of the opposing-member tubular part and is held by the opposing-member moving mechanism, and a first uneven part in which a recessed portion and a raised portion are alternately disposed concentrically on an upper surface of the opposing-member flange part. The opposing-member moving mechanism includes a holder lower part that opposes a lower surface of the opposing-member flange part in the up-down direction, a holder upper part that opposes the upper surface of the opposing-member flange part in the up-down direction, and a second uneven part in which a recessed portion and a raised portion are alternately disposed concentrically on a lower surface of the holder upper part. In a state in which the opposing member is located at the first position, the opposing-member flange part is supported from below by the holder lower part, and the opposing member is held by the opposing-member moving mechanism and spaced above the substrate holder. In a state in which the opposing member is located at the second position, the opposing member is spaced from the opposing-member moving mechanism, is held by the substrate holder, and is rotatable along with the substrate holder by the substrate rotation mechanism, a labyrinth is formed as a result of the raised portion of one of the first uneven part and the second uneven part being disposed within the recessed portion of the other of the first uneven part and the second uneven part with a gap therebetween, and a seal gas is supplied to the labyrinth to seal a nozzle gap from a space located on the radially outer side of the labyrinth, the nozzle gap being a space between the processing liquid nozzle and the opposing-member tubular part. This substrate processing apparatus can achieve flattening of the substrate processing apparatus.

In a preferred embodiment of the present invention, the holder upper part includes a peripheral jet opening for jetting the seal gas toward the labyrinth, between radially inner and outer ends of the labyrinth.

More preferably, the substrate processing apparatus further includes an annular manifold for temporarily storing the seal gas supplied from the seal gas supply part, between a seal gas supply part that is a supply source of the seal gas and the peripheral jet opening.

In another preferred embodiment of the present invention, a surface of the labyrinth that opposes the peripheral jet opening is an inclined surface that is inclined downward outwardly in a radial direction.

In another preferred embodiment of the present invention, the first uneven part includes a plurality of recessed portions, and a radially innermost recessed portion among the plurality of recessed portions is provided in an upper portion of the opposing-member tubular part and is larger than the other recessed portions in the up-down direction.

In another preferred embodiment of the present invention, the holder upper part includes a peripheral suction port for sucking a gas that is in the labyrinth in a radially outer end of the labyrinth.

In another preferred embodiment of the present invention, the gas supply part causes the treatment atmospheric gas to be jetted diagonally downward from a side surface of the processing liquid nozzle toward the nozzle gap.

Another substrate processing apparatus according to the present invention includes a substrate holder for holding a substrate in a horizontal position, a substrate rotation mechanism for rotating the substrate along with the substrate holder about a central axis pointing in an up-down direction, an opposing member including an opposing-member body that opposes an upper surface of the substrate and has an opposing-member opening in a central part, and an opposing-member tubular part that has a tubular shape and protrudes upward from a periphery of the opposing-member opening of the opposing-member body, a processing liquid nozzle inserted in the opposing-member tubular part and for supplying a processing liquid to the upper surface of the substrate through the opposing-member opening, a gas supply part for supplying a treatment atmospheric gas to a space between the opposing member and the substrate, a labyrinth that is contiguous with a nozzle gap and seals the nozzle gap from an external space as a result of a seal gas being supplied thereto, the nozzle gap being a space between the processing liquid nozzle and the opposing-member tubular part, and a seal-gas flow rate controller for controlling a flow rate of the seal gas supplied to the labyrinth on the basis of a relative relationship between a pressure in the labyrinth and a pressure in the external space. This substrate processing apparatus can suitably suppress the entry of the atmosphere from the external space.

In a preferred embodiment of the present invention, the relative relationship varies due to variations in pressure in the nozzle gap.

More preferably, the gas supply part causes the treatment atmospheric gas to be jetted diagonally downward from a side surface of the processing liquid nozzle toward the nozzle gap, and in a case where a flow rate of the treatment atmospheric gas jetted toward the nozzle gap varies, the seal-gas flow rate controller controls the flow rate of the seal gas on the basis of the variations in pressure in the nozzle gap that are caused by the variations in the flow rate of the treatment atmospheric gas.

In another preferred embodiment of the present invention, in a case where a rotation speed of the substrate rotated by the substrate rotation mechanism varies, the seal-gas flow rate controller controls the flow rate of the seal gas on the basis of the variations in pressure in the nozzle gap that are caused by the variations in the rotation speed.

In another preferred embodiment of the present invention, in a case where a type of processing performed on the substrate changes, the seal-gas flow rate controller controls the flow rate of the seal gas on the basis of the variations in pressure in the nozzle gap that are caused by the change in the type of processing.

In another preferred embodiment of the present invention, the substrate processing apparatus further includes a first pressure measuring part for measuring the pressure in the labyrinth, and a second pressure measuring part for measuring the pressure in the external space. The relative relationship is acquired on the basis of outputs of the first pressure measuring part and the second pressure measuring part.

In another preferred embodiment of the present invention, gas in the labyrinth is sucked at an end of the labyrinth on a side of the external space.

In another preferred embodiment of the present invention, the substrate processing apparatus further includes an opposing-member moving mechanism for holding the opposing member and moving the opposing member relative to the substrate holder in an up-down direction between a first position and a second position that is below the first position. The opposing member further includes an opposing-member flange part that annularly extends radially outward from an upper end of the opposing-member tubular part and is held by the opposing-member moving mechanism, and a first uneven part in which a recessed portion and a raised portion are alternately disposed concentrically on an upper surface of the opposing-member flange part. The opposing-member moving mechanism includes a holder lower part that opposes a lower surface of the opposing-member flange part in the up-down direction, a holder upper part that opposes the upper surface of the opposing-member flange part in the up-down direction, and a second uneven part in which a recessed portion and a raised portion are alternately disposed concentrically on a lower surface of the holder upper part. In a state in which the opposing member is located at the first position, the opposing-member flange part is supported from below by the holder lower part, and the opposing member is held by the opposing-member moving mechanism and spaced above the substrate holder. In a state in which the opposing member is located at the second position, the opposing member is spaced from the opposing-member moving mechanism, is held by the substrate holder, and is rotatable along with the substrate holder by the substrate rotation mechanism, and the labyrinth is formed as a result of the raised portion of one of the first uneven part and the second uneven part being disposed within the recessed portion of the other of the first uneven part and the second uneven part with a gap therebetween.

These and other objects, features, aspects and advantages of the present invention will become more apparent from the following detailed description of the present invention when taken in conjunction with the accompanying drawings.

DESCRIPTION OF EMBODIMENTS

Figure 1:
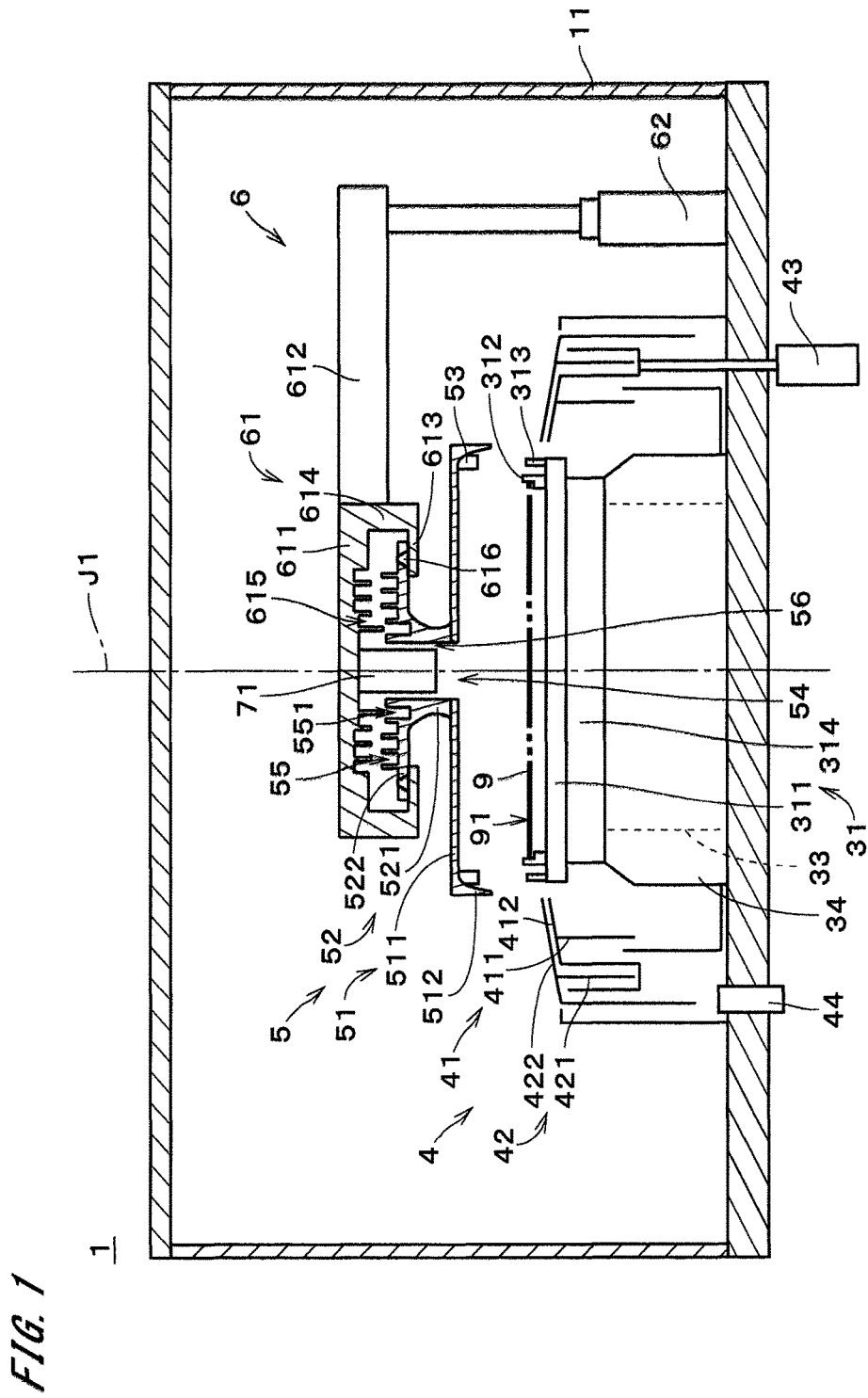
FIG. 1 is a cross-sectional view of a substrate processing apparatus according to an embodiment.

FIG. 1 is a cross-sectional view of a configuration of a substrate processing apparatus 1 according to a first embodiment of the present invention. The substrate processing apparatus 1 is a single wafer processing apparatus for processing semiconductor substrates 9 (hereinafter, simply referred to as "substrates 9") one at a time. The substrate processing apparatus 1 includes a substrate holder 31, a substrate rotation mechanism 33, a cup part 4, a top plate 5, an opposing-member moving mechanism 6, and a processing liquid nozzle 71.

The substrate holder 31 holds a substrate 9 in a horizontal position. The substrate holder 31 includes a holding base part 311, a plurality of chucks 312, a plurality of engagement parts 313, and a base supporter 314. The substrate 9 is disposed above the holding base part 311. The holding base part 311 and the base supporter 314 are generally disk-shaped members centered on a central axis J1 pointing in the up-down direction. The holding base part 311 is disposed above the base supporter 314 and supported from below by the base supporter 314. The outer diameter of the holding base part 311 is larger than the outer diameter of the base supporter 314. The holding base part 311 extends radially outward of the base supporter 314 along the entire periphery about the central axis J1.

The chucks 312 are generally equiangularly spaced from one another about the central axis J1 and circumferentially disposed on the outer periphery of the upper surface of the holding base part 311. In the substrate holder 31, the chucks 312 support the outer edge of the substrate 9. The engagement parts 313 are generally equiangularly spaced from one another about the central axis J1 and circumferentially disposed on the outer periphery of the upper surface of the holding base part 311. The engagement parts 313 are disposed on the radially outer side of the chucks 312.

The substrate rotation mechanism 33 is housed inside a rotation-mechanism housing part 34. The substrate rotation mechanism 33 and the rotation-mechanism housing part 34 are disposed below the substrate holder 31. The substrate rotation mechanism 33 rotates the substrate 9 along with the substrate holder 31 about the central axis J1.

The cup part 4 is an annular member centered on the central axis J1 and disposed on the radially outer side of the substrate 9 and the substrate holder 31. The cup part 4 is disposed along the entire peripheries of the substrate 9 and the substrate holder 31 and receives, for example, a processing liquid dispersed from the substrate 9 to the surroundings. The cup part 4 includes a first guard 41, a second guard 42, a guard moving mechanism 43, and a discharge port 44.

The first guard 41 includes a first-guard side wall part 411 and a first-guard canopy part 412. The first-guard side wall part 411 has a generally cylindrical shape centered on the central axis J1. The first-guard canopy part 412 has a generally annular plate-like shape centered on the central axis J1 and extends radially inward from the upper end of the first-guard side wall part 411. The second guard 42 includes a second-guard side wall part 421 and a second-guard canopy part 422. The second-guard side wall part 421 has a generally cylindrical shape centered on the central axis J1 and is located on the radially outer side of the first-guard side wall part 411. The second-guard canopy part 422 has a generally annular plate-like shape centered on the central axis J1 and extends radially inward from the upper end of the second-guard side wall part 421 above the first-guard canopy part 412. The inner diameter of the first-guard canopy part 412 and the inner diameter of the second-guard canopy part 422 are slightly larger than the outer diameter of the holding base part 311 of the substrate holder 31 and the outer diameter of the top plate 5.

The guard moving mechanism 43 switches the guard for receiving a processing liquid or the like from the substrate 9 between the first guard 41 and the second guard 42 by moving the first guard 41 in the up-down direction. The processing liquid or the like received by the first guard 41 and the second guard 42 of the cup part 4 is discharged through the discharge port 44 to the outside of the housing 11. Gas in the first guard 41 and the second guard 42 is also exhausted through the discharge port 44 to the outside of the housing 11.

The top plate 5 is a generally circular member in a plan view. The top plate 5 is an opposing member that opposes an upper surface 91 of the substrate 9 and acts as a shield plate that shields the top of the substrate 9. The outer diameter of the top plate 5 is larger than the outer diameter of the substrate 9 and the outer diameter of the holding base part 311. The top plate 5 includes an opposing-member body 51, a held part 52, a plurality of engagement parts 53, and a first uneven part 55. The opposing-member body 51 includes an opposing-member canopy part 511 and an opposing-member side wall part 512. The opposing-member canopy part 511 is a generally annular plate-like member centered on the central axis J1 and opposes the upper surface 91 of the substrate 9. The opposing-member canopy part 511 has an opposing-member opening 54 in the central part. The opposing-member opening 54 is, for example, generally circular in a plan view. The diameter of the opposing-member opening 54 is sufficiently smaller than the diameter of the substrate 9. The opposing-member side wall part 512 is a generally cylindrical member centered on the central axis J1 and extends downward from the outer periphery of the opposing-member canopy part 511.

The engagement parts 53 are generally equiangularly spaced from one another about the central axis J1 and circumferentially disposed on the outer periphery of the lower surface of the opposing-member canopy part 511. The engagement parts 53 are disposed on the radially inner side of the opposing-member side wall part 512.

The held part 52 is connected to the upper surface of the opposing-member body 51. The held part 52 includes an opposing-member tubular part 521 and an opposing-member flange part 522. The opposing-member tubular part 521 is a generally tubular part that protrudes upward from the periphery of the opposing-member opening 54 of the opposing-member body 51. The opposing-member tubular part 521 has, for example, a generally cylindrical shape centered on the central axis J1. The opposing-member flange part 522 annularly extends radially outward from the upper end of the opposing-member tubular part 521. The opposing-member flange part 522 has, for example, a generally annular plate-like shape centered on the central axis J1. In the upper surface of the opposing-member flange part 522, the first uneven part 55 is provided in which circumferential recessed portions and circumferential raised portions are alternately disposed concentrically. The first uneven part 55 includes a plurality of recessed portions and a plurality of raised portions. A radially innermost recessed portion 551 among the plurality of recessed portions is provided in an upper portion of the opposing-member tubular part 521 and is larger than the other recessed portions of the first uneven part 55 in the up-down direction.

The opposing-member moving mechanism 6 includes an opposing-member holder 61 and an opposing-member elevating mechanism 62. The opposing-member holder 61 holds the held part 52 of the top plate 5. The opposing-member holder 61 includes a holder body 611, a body supporter 612, a flange supporter 613, a supporter connector 614, and a second uneven part 615. The holder body 611 has, for example, a generally disk-like shape centered on the central axis J1. The holder body 611 covers the top of the opposing-member flange part 522 of the top plate 5. The body supporter 612 is a rod-like arm that extends generally horizontally. One end of the body supporter 612 is connected to the holder body 611, and the other end is connected to the opposing-member elevating mechanism 62.

The processing liquid nozzle 71 protrudes downward from the central part of the holder body 611. The processing liquid nozzle 71 is inserted in the opposing-member tubular part 521 in a non-contact state. In the following description, the space between the processing liquid nozzle 71 and the opposing-member tubular part 521 is referred to as a "nozzle gap 56." Around the processing liquid nozzle 71 is provided the second uneven part 615 in which circumferential recessed portions and circumferential raised portions are alternately disposed concentrically on the lower surface of the holder body 611. The second uneven part 615 opposes the first uneven part 55 in the up-down direction.

The flange supporter 613 has, for example, a generally annular plate-like shape centered on the central axis J1. The flange supporter 613 is located below the opposing-member flange part 522. The inner diameter of the flange supporter 613 is smaller than the outer diameter of the opposing-member flange part 522 of the top plate 5. The outer diameter of the flange supporter 613 is larger than the outer diameter of the opposing-member flange part 522 of the top plate 5. The supporter connector 614 has, for example, a generally cylindrical shape centered on the central axis J1. The supporter connector 614 connects the flange supporter 613 and the holder body 611 around the opposing-member flange part 522. In the opposing-member holder 61, the holder body 611 is a holder upper part that opposes the upper surface of the opposing-member flange part 522 in the up-down direction, and the flange supporter 613 is a holder lower part that opposes the lower surface of the opposing-member flange part 522 in the up-down direction.

With the top plate 5 located at the position illustrated in FIG. 1, the flange supporter 613 is in contact with and supports the outer periphery of the opposing-member flange part 522 of the top plate 5 from the underside. In other words, the opposing-member flange part 522 is held by the opposing-member holder 61 of the opposing-member moving mechanism 6. Thus, the top plate 5 is suspended from the opposing-member holder 61 above the substrate 9 and the substrate holder 31. In the following description, the position of the top plate 5 in the up-down direction in FIG. 1 is referred to as a "first position." The top plate 5 located at the first position is held by the opposing-member moving mechanism 6 and spaced above the substrate holder 31. With the top plate 5 located at the first position, the lower ends of the raised portions of the second uneven part 615 are located above the upper ends of the raised portions of the first uneven part 55.

The flange supporter 613 is provided with a movement restricting part 616 for restricting positional shift of the top plate 5 (i.e., movement and rotation of the top plate 5). In the example illustrated in FIG. 1, the movement restricting part 616 is a protruding part that protrudes upward from the upper surface of the flange supporter 613. Positional shift of the top plate 5 is restricted by inserting the movement restricting part 616 in a hole provided in the opposing-member flange part 522.

Figure 2:
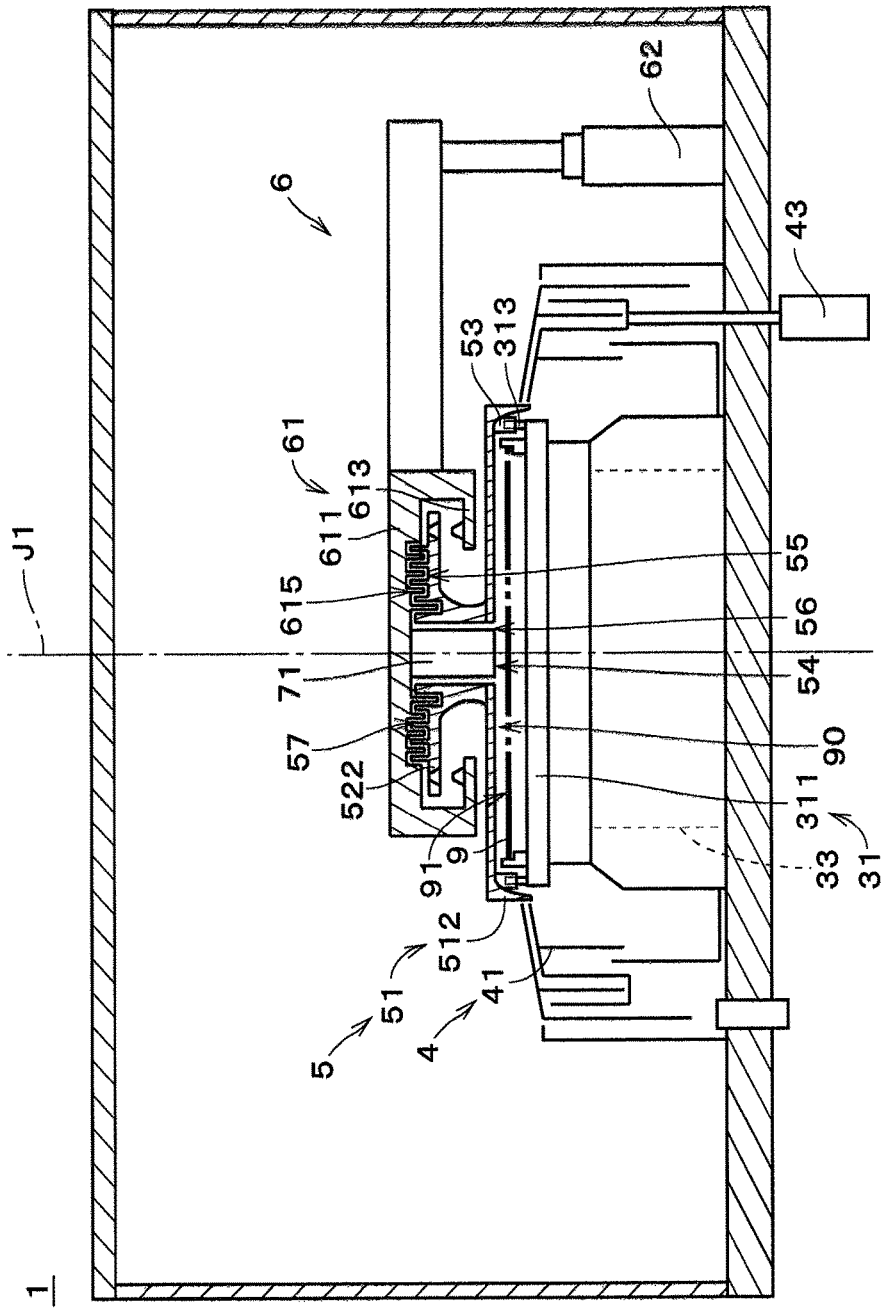
FIG. 2 is a cross-sectional view of the substrate processing apparatus.

The opposing-member elevating mechanism 62 moves the top plate 5 along with the opposing-member holder 61 in the up-down direction. FIG. 2 is a cross-sectional view illustrating a state in which the top plate 5 has been moved down from the first position illustrated in FIG. 1. In the following description, the position of the top plate 5 in the up-down direction in FIG. 2 is referred to as a "second position." That is, the opposing-member elevating mechanism 62 moves the top plate 5 relative to the substrate holder 31 between the first position and the second position in the up-down direction. The second position is a position below the first position. In other words, the second position is a position at which the top plate 5 is closer to the substrate holder 31 in the up-down direction than at the first position.

With the top plate 5 located at the second position, the engagement parts 53 of the top plate 5 are respectively engaged with the engagement parts 313 of the substrate holder 31. The engagement parts 53 are supported from below by the engagement parts 313. In other words, the engagement parts 313 are opposing-member supporters that support the top plate 5. For example, the engagement parts 313 are pins that extend generally parallel to the up-down direction, and the upper ends of the engagement parts 313 fit into upwardly opening recesses that are formed in the lower ends of the engagement parts 53. The opposing-member flange part 522 of the top plate 5 is spaced above the flange supporter 613 of the opposing-member holder 61. Thus, the top plate 5 located at the second position is held by the substrate holder 31 and spaced from the opposing-member moving mechanism 6 (i.e., without being in contact with the opposing-member moving mechanism 6).

With the top plate 5 held by the substrate holder 31, the lower end of the opposing-member side wall part 512 of the top plate 5 is located below the upper surface of the holding base part 311 of the substrate holder 31 or at the same position as the upper surface of the holding base part 311 in the up-down direction. When the substrate rotation mechanism 33 is driven with the top plate 5 located at the second position, the top plate 5 rotates along with the substrate 9 and the substrate holder 31. In other words, the top plate 5 located at the second position is rotatable along with the substrate 9 and the substrate holder 31 about the central axis J1 by the substrate rotation mechanism 33.

Figure 3:
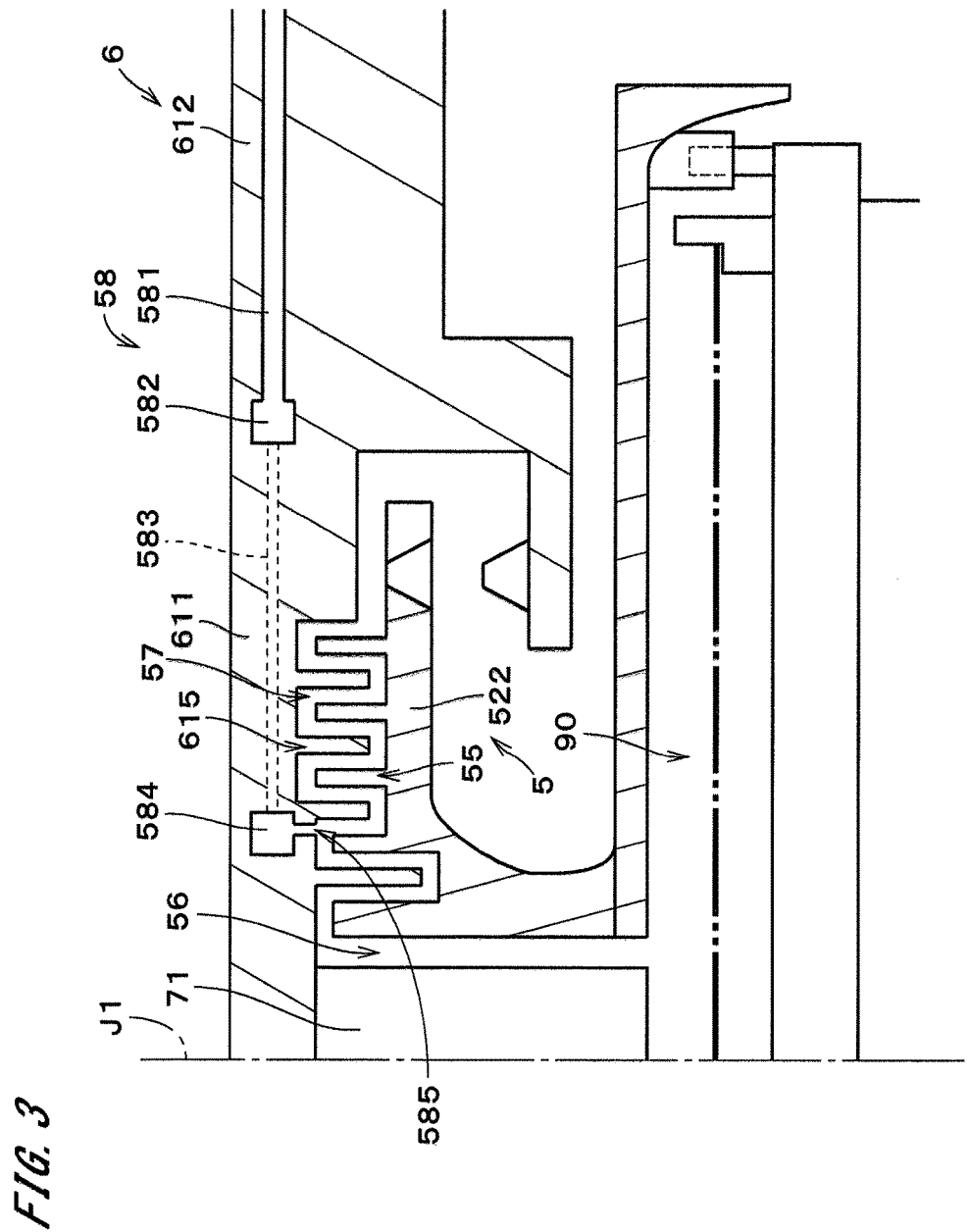
FIG. 3 is an enlarged cross-sectional view of part of a top plate and an opposing-member moving mechanism.

FIG. 3 is an enlarged cross-sectional view of part of the top plate 5 and the opposing-member moving mechanism 6. As illustrated in FIGS. 2 and 3, the first uneven part 55 and the second uneven part 615 are in a non-contact state in close proximity to each other in the up-down direction when the top plate 5 is located at the second position. The raised portions of the first uneven part 55 are disposed inside the recessed portions of the second uneven part 615 with a gap therebetween, and the raised portions of the second uneven part 615 are disposed within the recessed portions of the first uneven part 55 with a gap therebetween. In other words, the raised portions of one of the first uneven part 55 and the second uneven part 615 are disposed within the recessed portions of the other of the first uneven part 55 and the second uneven part 615 with a gap therebetween. Thus, a labyrinth 57 is formed between the opposing-member flange part 522 of the top plate 5 and the holder body 611 of the opposing-member moving mechanism 6 around the processing liquid nozzle 71. The distance in the up-down direction between the first uneven part 55 and the second uneven part 615 and the distance in the radial direction therebetween are each approximately constant throughout the entire labyrinth 57. The labyrinth 57 is contiguous with the nozzle gap 56. When the top plate 5 is rotated, the first uneven part 55 rotates, and the second uneven part 615 does not rotate.

Figure 4:
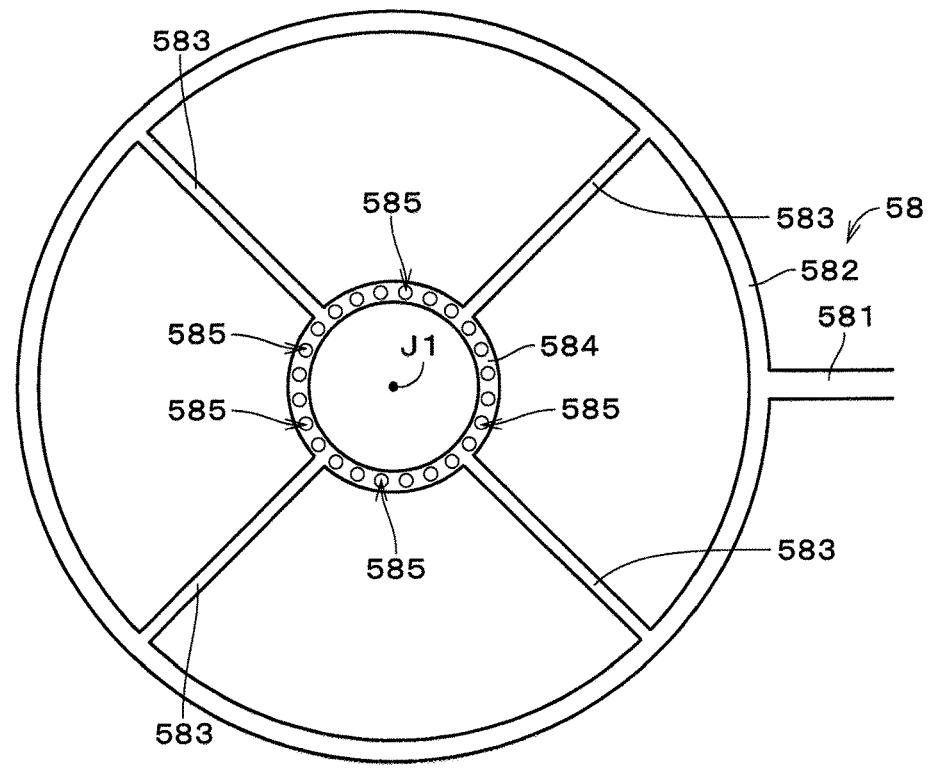
FIG. 4 is a plan view of a gas supply passage.

As illustrated in FIG. 3, the opposing-member holder 61 includes a gas supply passage 58 that is connected to the labyrinth 57. Note that the gas supply passage 58 is not shown in FIGS. 1 and 2 described above. FIG. 4 is a plan view of the gas supply passage 58. As illustrated in FIGS. 3 and 4, the gas supply passage 58 includes a first passage 581, a first manifold 582, a plurality of second passages 583, a second manifold 584, and a plurality of gas jet openings 585. The first manifold 582, the second passages 583, and the second manifold 584 are formed inside the holder body 611, and the gas jet openings 585 are formed in the lower surface of the holder body 611. The first passage 581 is formed inside the body supporter 612.

The gas jet openings 585 are circumferentially disposed at generally equiangular intervals in the upper surface of one recessed portion (i.e., bottom surface of the recessed portion) of the second uneven part 615. The gas jet openings 585 are peripheral jet openings that are circumferentially disposed about the central axis J1. The peripheral jet openings are disposed between the radially inner and outer ends of the labyrinth 57. The gas supply passage 58 may, for example, include one generally annular jet opening centered on the central axis J1 as a peripheral jet opening, instead of the plurality of gas jet openings 585.

The second manifold 584 is disposed above and connected to the gas jet openings 585. The second manifold 584 is a generally annular passage centered on the central axis J1. The first manifold 582 is disposed on the radially outer side of the second manifold 584. The first manifold 582 is a generally annular passage centered on the central axis J1. The second passages 583 are linear passages that extend generally in the radial direction and connect the first manifold 582 and the second manifold 584. In the example illustrated in FIG. 4, four second passages 583 are circumferentially disposed at generally equiangular intervals. The first passage 581 extends radially outward from the first manifold 582. The first passage 581 is disposed at a different position in the circumferential direction from the positions of the second passages 583.

Figure 5:
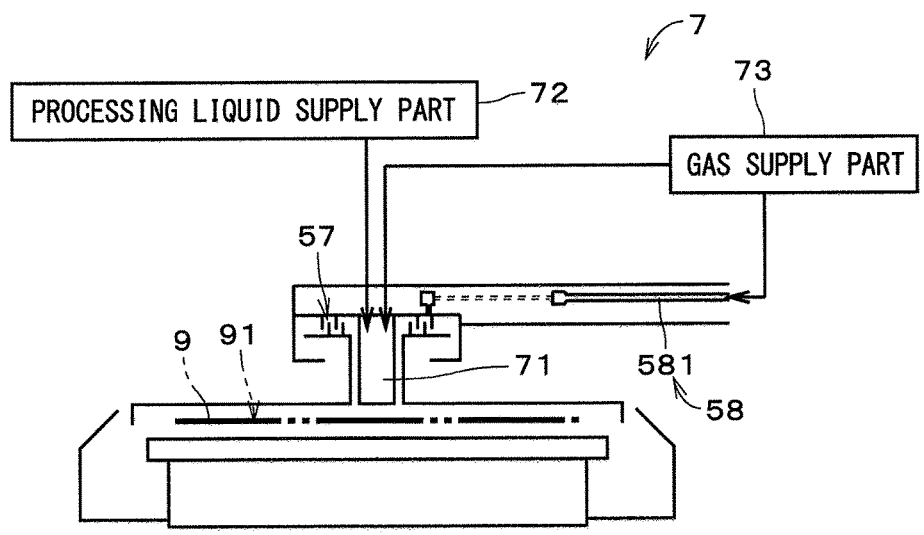
FIG. 5 is a block diagram of a gas-liquid supply part.

FIG. 5 is a block diagram of a gas-liquid supply part 7 that is related to the supply of gas and processing liquid in the substrate processing apparatus 1. The gas-liquid supply part 7 includes the processing liquid nozzle 71, a processing liquid supply part 72, and a gas supply part 73. The processing liquid supply part 72 is connected to the processing liquid nozzle 71. The gas supply part 73 is connected to the processing liquid nozzle 71 and supplies a gas to the processing liquid nozzle 71. The gas supply part 73 is also connected to the first passage 581 of the gas supply passage 58 provided in the opposing-member holder 61 and supplies a gas to the labyrinth 57 through the gas supply passage 58.

In the substrate processing apparatus 1, various types of liquids are used as processing liquids. The processing liquid may, for example, be a chemical solution (e.g., a polymer removing solution or an etchant such as hydrofluoric acid or an aqueous solution of tetra methyl ammonium hydroxide) used in chemical solution processing of the substrate 9. The processing liquid may, for example, be a cleaning liquid such as deionized water (DIW) or carbonated water that is used in the cleaning processing of the substrate 9. The processing liquid may, for example, be isopropyl alcohol (IPA) that is supplied to replace the liquid on the substrate 9. The gas supplied from the gas supply part 73 may, for example, be an inert gas such as a nitrogen (N2) gas. Alternatively, the gas supply part 73 may supply various gases other than an inert gas.

Figure 6:
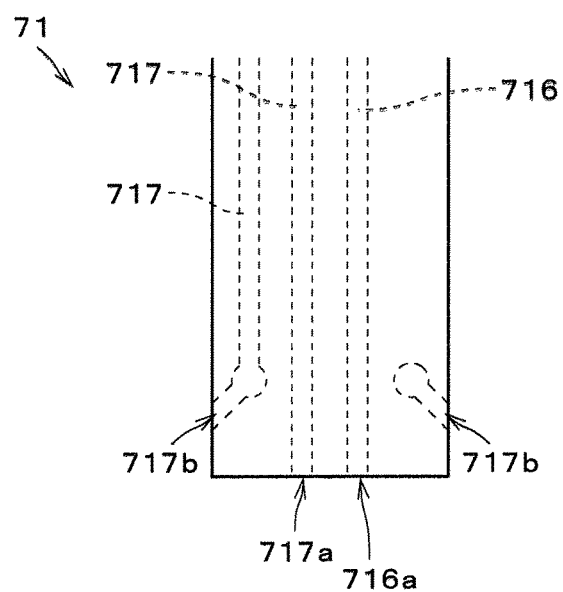
FIG. 6 is an enlarged cross-sectional view of part of a processing liquid nozzle.

FIG. 6 is an enlarged cross-sectional view of part of the processing liquid nozzle 71. The processing liquid nozzle 71 may be made of, for example, tetrafluoroethylene-perfluoroalkylvinylether copolymer (PFA). The processing liquid nozzle 71 includes a processing liquid passage 716 and two gas passages 717. The processing liquid passage 716 is connected to the processing liquid supply part 72 illustrated in FIG. 5. The two gas passages 717 are connected to the gas supply part 73 illustrated in FIG. 5.

The processing liquid supplied from the processing liquid supply part 72 to the processing liquid passage 716 in FIG. 6 is ejected downward from an ejection port 716a provided in the lower end surface of the processing liquid nozzle 71. When a plurality of types of processing liquids are ejected from the processing liquid nozzle 71, the processing liquid nozzle 71 may include a plurality of processing liquid passages 716 that correspond respectively to the plurality of types of processing liquids, and the plurality of types of processing liquids may be ejected respectively from a plurality of ejection ports 716a.

The inert gas supplied from the gas supply part 73 to the gas passage 717 in the center of the nozzle (the gas passage 717 on the right in FIG. 6) is supplied (e.g., jetted) downward from a lower-surface jet opening 717a provided in the lower end surface of the processing liquid nozzle 71. The inert gas supplied from the gas supply part 73 to the gas passage 717 in the outer periphery of the nozzle is supplied to the surroundings from a plurality of side-surface jet openings 717*b* provided in the side surface of the processing liquid nozzle 71.

The side-surface jet openings 717*b* are arrayed at generally equiangular intervals in the peripheral direction. The side-surface jet openings 717*b* are connected to a peripheral passage that extends in the peripheral direction from the lower ends of the gas passages 717. The inert gas supplied from the gas supply part 73 is supplied (e.g., jetted) diagonally downward from the side-surface jet openings 717*b*. Note that there may be only one side-surface jet opening 717*b*.

The processing liquid supplied from the processing liquid supply part 72 (see FIG. 5) is ejected from the ejection port 716*a* of the processing liquid nozzle 71 through the opposing-member opening 54 illustrated in FIG. 2 toward the upper surface 91 of the substrate 9. In other words, the processing liquid nozzle 71 supplies the processing liquid supplied from the processing liquid supply part 72 to the upper surface 91 of the substrate 9 through the opposing-member opening 54. In the substrate processing apparatus 1, the processing liquid nozzle 71 may protrude downward through the opposing-member opening 54 of the opposing-member body 51. In other words, the tip end of the processing liquid nozzle 71 may be located below the lower end of the opposing-member opening 54. The processing liquid supplied from the processing liquid supply part 72 flows downward in the processing liquid nozzle 71 through the opposing-member opening 54 and is ejected from the ejection port 716*a* (see FIG. 6) of the processing liquid nozzle 71 toward the upper surface 91 of the substrate 9. Supplying the processing liquid through the opposing-member opening 54 includes not only a state in which the processing liquid that is ejected from the processing liquid nozzle 71 above the opposing-member opening 54 passes through the opposing-member opening 54, but also a state in which the processing liquid is ejected through the processing liquid nozzle 71 that is inserted in the opposing-member opening 54.

Part of the inert gas supplied from the gas supply part 73 (see FIG. 5) to the processing liquid nozzle 71 is supplied from the lower-surface jet opening 717*a* (see FIG. 6) of the processing liquid nozzle 71 through the opposing-member opening 54 to the space between the top plate 5 and the substrate 9 (hereinafter, referred to as a "processing space 90"). Part of the inert gas supplied from the gas supply part 73 to the processing liquid nozzle 71 is supplied from the side-surface jet openings 717*b* (see FIG. 6) of the processing liquid nozzle 71 to the nozzle gap 56. In the nozzle gap 56, the inert gas from the gas supply part 73 is supplied diagonally downward from the side surface of the processing liquid nozzle 71, flows downward, and is supplied to the processing space 90.

In the substrate processing apparatus 1, the processing of the substrate 9 is preferably performed in the state in which the processing space 90 is in an inert gas atmosphere after the supply of the inert gas from the processing liquid nozzle 71 to the processing space 90. In other words, the gas supplied from the gas supply part 73 to the processing space 90 is a treatment atmospheric gas. The treatment atmospheric gas includes a gas that is supplied from the processing liquid nozzle 71 to the nozzle gap 56 and supplied through the nozzle gap 56 to the processing space 90.

The inert gas supplied from the gas supply part 73 to the first passage 581 of the gas supply passage 58 illustrated in FIGS. 3 and 4 spreads peripherally in the first manifold 582 and is guided through the second passages 583 to the second manifold 584. The inert gas also spreads peripherally in the second manifold 584 and is jetted from the gas jet openings 585 toward the lower labyrinth 57, between the radially inner and outer ends of the labyrinth 57. Though this supply of the inert gas from the gas jet openings 585 to the labyrinth 57, the nozzle gap 56, which is the space located on the radially inner side of the labyrinth 57, and the processing space 90, which is contiguous with the nozzle gap 56, are sealed from the space located on the radially outer side of the labyrinth 57. That is, the gas supplied from the gas supply part 73 to the labyrinth 57 serves as a seal gas. The inert gas supplied from the gas jet openings 585 to the labyrinth 57 spreads radially outward and inward in the labyrinth 57.

In the example illustrated in FIG. 5, the gas supply part 73 is a seal gas supply part that is a supply source of the seal gas, and also serves as a treatment atmospheric gas supply part that is a supply source of the treatment atmospheric gas. The treatment atmospheric gas and the seal gas are gases of the same type. Note that the treatment atmospheric gas and the seal gas may be different types of gases. In the gas supply passage 58, the first manifold 582 and the second manifold 584 are annular manifolds for temporarily storing the seal gas between the gas supply part 73, which is a seal gas supply part, and the gas jet openings 585.

Next, an exemplary procedure of processing performed on the substrate 9 by the substrate processing apparatus 1 will be described with reference to FIG, 7. First, with the top plate 5 located at the first position in FIG. 1, the substrate 9 is conveyed into the housing 11 and held by the substrate holder 31 (step S11). At this time, the top plate 5 is held by the opposing-member holder 61 of the opposing-member moving mechanism 6.

Then, the opposing-member holder 61 is moved down by the opposing-member elevating mechanism 62. Thus, the top plate 5 is moved down from the first position to the second position and held by the substrate holder 31 as illustrated in FIG. 2 (step S12). Also, the labyrinth 57 is formed between the top plate 5 and the opposing-member holder 61 as illustrated in FIGS. 2 and 3. Then, the supply of an inert gas (i.e., treatment atmospheric gas) from the gas supply part 73 through the processing liquid nozzle 71 to the nozzle gap 56 and the processing space 90 is started. The supply of an inert gas (i.e., seal gas) from the gas supply part 73 through the gas supply passage 58 (see FIG. 3) to the labyrinth 57 is also started.

Then, the substrate rotation mechanism 33 illustrated in FIG. 2 starts rotating the substrate holder 31, the substrate 9, and the top plate 5 (step S13). The supply of the inert gas from the processing liquid nozzle 71 and the supply of the inert gas to the labyrinth 57 are continued after step S13. Then, the first processing liquid is supplied from the processing liquid supply part 72 to the processing liquid nozzle 71 and supplied through the opposing-member opening 54 of the top plate 5 located at the second position to the central part of the upper surface 91 of the substrate 9 that is being rotated (step S14).

The first processing liquid supplied from the processing liquid nozzle 71 to the central part of the substrate 9 is spread radially outward from the central part of the substrate 9 over the entire upper surface 91 of the substrate 9 by the rotation of the substrate 9. The first processing liquid is dispersed radially outward from the outer edge of the substrate 9 and received by the first guard 41 of the cup part 4. The position of the first guard 41 in the up-down direction in FIG. 2 is a position at which the first guard 41 receives the processing liquid from the substrate 9, and therefore referred to as a "liquid receiving position" in the following description. The first processing liquid is applied to the substrate 9 for a predetermined period of time, thus ending the processing of the substrate 9 using the first processing liquid.

The first processing liquid may, for example, be a chemical solution such as a polymer removing liquid or an etchant, and in step S14, chemical solution processing is performed on the substrate 9. Note that the supply of the first processing liquid (step S14) may be performed before the rotation of the substrate 9 is started (step S13). In this case, a puddle of the first processing liquid is formed on the entire upper surface 91 of the substrate 9 that is in a stationary state, and puddling using the first processing liquid is performed.

Figure 8:
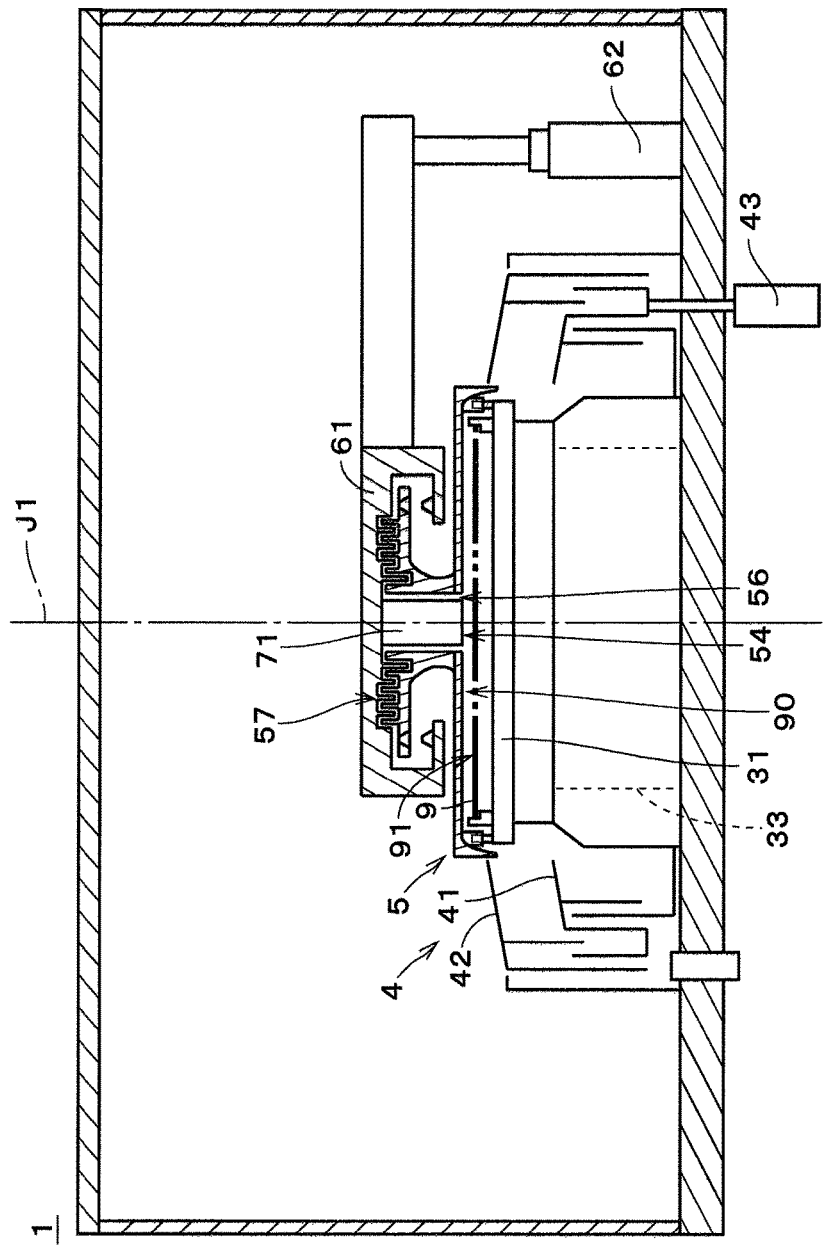
FIG. 8 is a cross-sectional view of the substrate processing apparatus.

When the processing of the substrate 9 using the first processing liquid has ended, the supply of the first processing liquid from the processing liquid nozzle 71 is stopped. Then, the first guard 41 is moved down by the guard moving mechanism 43 and located at a retracted position that is below the aforementioned liquid receiving position as illustrated in FIG. 8, Accordingly, the guard for receiving the processing liquid from the substrate 9 is switched from the first guard 41 to the second guard 42. That is, the guard moving mechanism 43 is a guard switching mechanism for switching the guard for receiving the processing liquid from the substrate 9 between the first guard 41 and the second guard 42 by moving the first guard 41 between the liquid receiving position and the retracted position in the up-down direction.

Then, a second processing liquid is supplied from the processing liquid supply part 72 to the processing liquid nozzle 71 and supplied through the opposing-member opening 54 of the top plate 5 located at the second position to the central part of the upper surface 91 of the substrate 9 that is being rotated (step S15). The second processing liquid supplied from the processing liquid nozzle 71 to the central part of the substrate 9 is spread radially outward from the central part of the substrate 9 and applied to the entire upper surface 91 of the substrate 9 by the rotation of the substrate 9. The second processing liquid is dispersed radially outward from the outer edge of the substrate 9 and received by the second guard 42 of the cup part 4. The second processing liquid is applied to the substrate 9 for a predetermined period of time, thus ending the processing of the substrate 9 using the second processing liquid. The second processing liquid may, for example, be a cleaning liquid such as deionized water or carbonated water, and in step S15, cleaning processing is performed on the substrate 9.

When the processing of the substrate 9 using the second processing liquid has ended, the supply of the second processing liquid from the processing liquid nozzle 71 is stopped. Then, the flow rate of the inert gas jetted from the gas supply part 73 through the side surface of the processing liquid nozzle 71 toward the nozzle gap 56 increases. The flow rate of the inert gas jetted from the lower end surface of the processing liquid nozzle 71 toward the processing space 90 also increases. Moreover, the rotation speed of the substrate 9 rotated by the substrate rotation mechanism 33 increases. Accordingly, the second processing liquid or the like remaining on the upper surface 91 of the substrate 9 moves radially outward, and is thus dispersed radially outward from the outer edge of the substrate 9 and received by the second guard 42 of the cup part 4. By continuing the rotation of the substrate 9 for a predetermined period of time, dry processing for removing the processing liquid from the upper surface 91 of the substrate 9 is performed (step S16).

When the dry processing of the substrate 9 has ended, the substrate rotation mechanism 33 stops rotating the substrate holder 31, the substrate 9, and the top plate 5 (step S17). The supply of the inert gas from the gas supply part 73 to the nozzle gap 56, the processing space 90, and the labyrinth 57 is also stopped. Then, the opposing-member holder 61 is moved upward by the opposing-member elevating mechanism 62, and accordingly the top plate 5 is moved upward from the second position to the first position illustrated in FIG. 1 (step S18). The top plate 5 is spaced above the substrate holder 31 and held by the opposing-member holder 61. Thereafter, the substrate 9 is conveyed out of the housing 11 (step S19). In the substrate processing apparatus 1, the above-described steps S11 to S19 are sequentially performed on a plurality of substrates 9 to process the substrates 9 sequentially.

As described above, in the substrate processing apparatus 1, the top plate 5 located at the first position is held by the opposing-member holder 61 and spaced above the substrate holder 31. The top plate 5 is held by the substrate holder 31 at the second position below the first position and rotated along with the substrate 9 and the substrate holder 31 by the substrate rotation mechanism 33. The gas supply part 73 supplies the treatment atmospheric gas to the processing space 90 between the top plate 5 and the substrate 9. This configuration allows a desired gas atmosphere to be created in the processing space 90 and allows the substrate 9 to be processed in this gas atmosphere. For example, when an inert gas is supplied to the processing space 90, the substrate 9 can be processed in an inert gas atmosphere (i.e., low oxygen atmosphere).

In the substrate processing apparatus 1, since the substrate 9 and the top plate 5 are rotated about the central axis J1 as described above, the pressure in a region (hereinafter referred to as a "central region") of the processing space 90 above the central part of the substrate 9 is lower than ambient pressure. Thus, the gas in the nozzle gap 56 that is contiguous with the processing space 90 above this central region is sucked into the processing space 90.

The nozzle gap 56 is contiguous at the upper end with the outside space (hereinafter, referred to as "external space") other than the processing space 90 and the nozzle gap 56. Thus, if the aforementioned labyrinth 57 is not present, negative pressure generated in the central region of the processing space may cause the atmosphere in the external space to enter from the upper end of the nozzle gap and then enter the processing space through the nozzle gap.

In contrast, the substrate processing apparatus 1 includes the labyrinth 57 provided around the processing liquid nozzle 71 above the nozzle gap 56 as illustrated in FIG. 2, and the nozzle gap 56 is sealed from the external space (specifically, the space located on the radially outer side of the labyrinth 57) by supplying the seal gas to the labyrinth 57. This configuration consequently suppresses the entry of the atmosphere of the external space into the processing space 90 through the nozzle gap 56.

The substrate processing apparatus 1 also includes the first uneven part 55 provided on the upper surface of the opposing-member flange part 522 of the top plate 5, and the second uneven part 615 provided on the lower surface of the holder body 611 of the opposing-member moving mechanism 6. Then, only when the top plate 5 is located at the second position (i.e., the processing space 90 for processing the substrate 9 is created), the labyrinth 57 is formed by disposing the raised portions of one of the first uneven part 55 and the second uneven part 615 within the recessed portions of the other of the first uneven part 55 and the second uneven part 615 with a gap therebetween. This configuration achieves flattening of the substrate processing apparatus 1 (i.e., miniaturization in the up-down direction), as compared with substrate processing apparatuses having a structure in which a labyrinth is always present irrespective of the position of the top plate in the up-down direction.

In the substrate processing apparatus 1, the treatment atmospheric gas is jetted diagonally downward from the gas supply part 73 through the side surface of the processing liquid nozzle 71 toward the nozzle gap 56. Thus, the treatment atmospheric gas flows downward in the nozzle gap 56, and the pressure in the nozzle gap 56 becomes lower than the pressure in the external space (i.e., negative pressure is generated). If the aforementioned labyrinth 57 is not present, the atmosphere in the external space may enter from the upper end of the nozzle gap and then enter the processing space through the nozzle gap. As described above, in the substrate processing apparatus 1, the labyrinth 57 to which the seal gas is supplied is provided around the processing liquid nozzle 71 above the nozzle gap 56, and the presence of the labyrinth 57 allows the nozzle gap 56 to be sealed from the external space. Consequently, even when the treatment atmospheric gas is jetted diagonally downward from the side surface of the processing liquid nozzle 71, it is possible to suppress the entry of the atmosphere of the external space into the processing space 90 through the nozzle gap 56.

In the first uneven part 55 forming the labyrinth 57, the radially innermost recessed portion 551 among the plurality of recessed portions is provided in the upper portion of the opposing-member tubular part 521 and is larger than the other recessed portions of the first uneven part 55 in the up-down direction. This configuration further suppresses the entry of the atmosphere of the external space into the radially inner side of the radially inner end of the labyrinth 57. Consequently, it is possible to further suppress the entry of the atmosphere of the external space into the processing space 90 through the nozzle gap 56.

In the opposing-member moving mechanism 6, the holder body 611 of the opposing-member holder 61 includes peripheral jet openings (in the example illustrated in FIG. 4, the gas jet openings 585) for ejecting the seal gas toward the labyrinth 57, between the radially inner and outer ends of the labyrinth 57. Thus, the seal gas supplied from the gas supply part 73 to the labyrinth 57 spreads radially outward and inward in the labyrinth 57. Forming the radially outward flow of the seal gas in the labyrinth 57 in this way suppresses the entry of the atmosphere of the external space into the labyrinth 57. Also, forming the radially inward flow of the seal gas in the labyrinth 57 reduces the negative pressure generated by the rotation of the substrate 9 and the emission of the treatment atmospheric gas from the processing liquid nozzle 71 to the nozzle gap 56. Consequently, it is possible to further suppress the entry of the atmosphere of the external space into the labyrinth 57.

The substrate processing apparatus 1 includes the annular first manifold 582 for temporarily storing the seal gas between the above peripheral jet openings and the gas supply part 73, which is the supply source of the seal gas. This configuration improves uniformity of the flow rate of the seal gas jetted from the peripheral jet openings in the peripheral direction. The provision of the second manifold 584 similar to the first manifold 582 further improves uniformity of the flow rate of the seal gas jetted from the peripheral jet openings in the peripheral direction.

Figure 9:
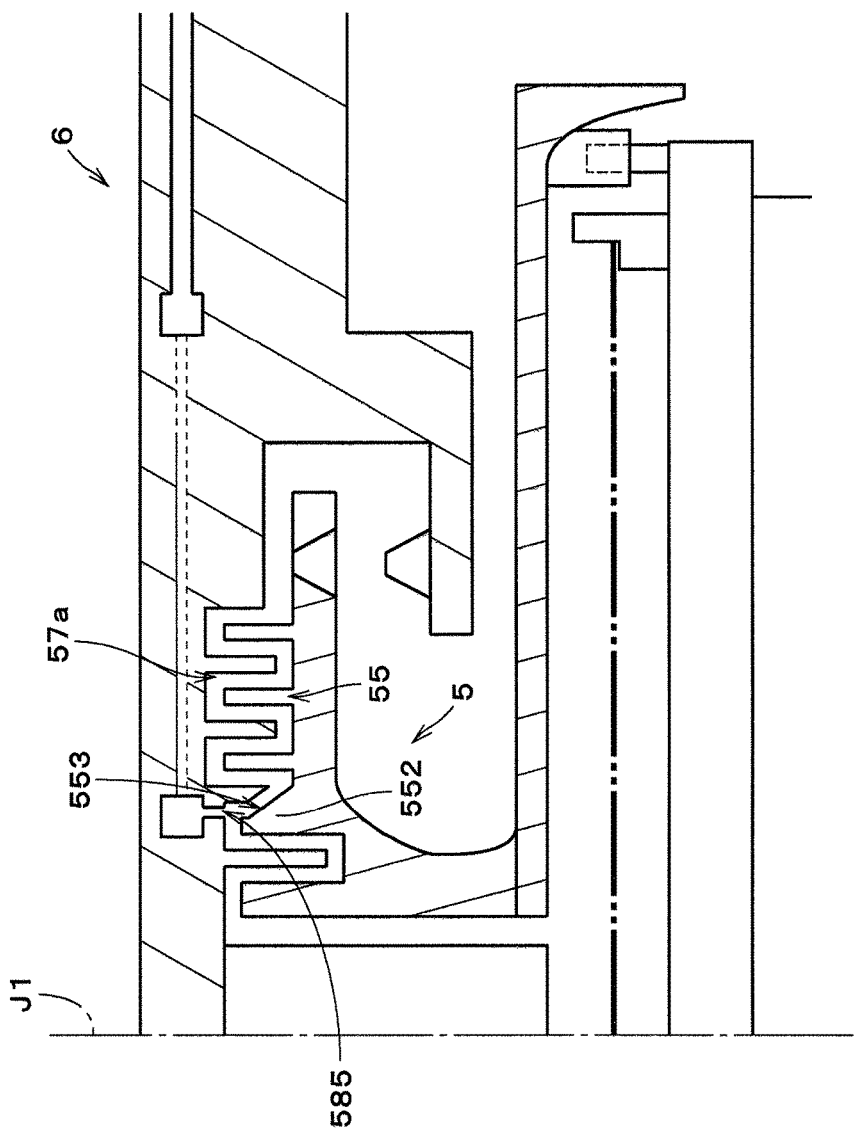
FIG. 9 is a cross-sectional view of another exemplary labyrinth.
Figure 10:
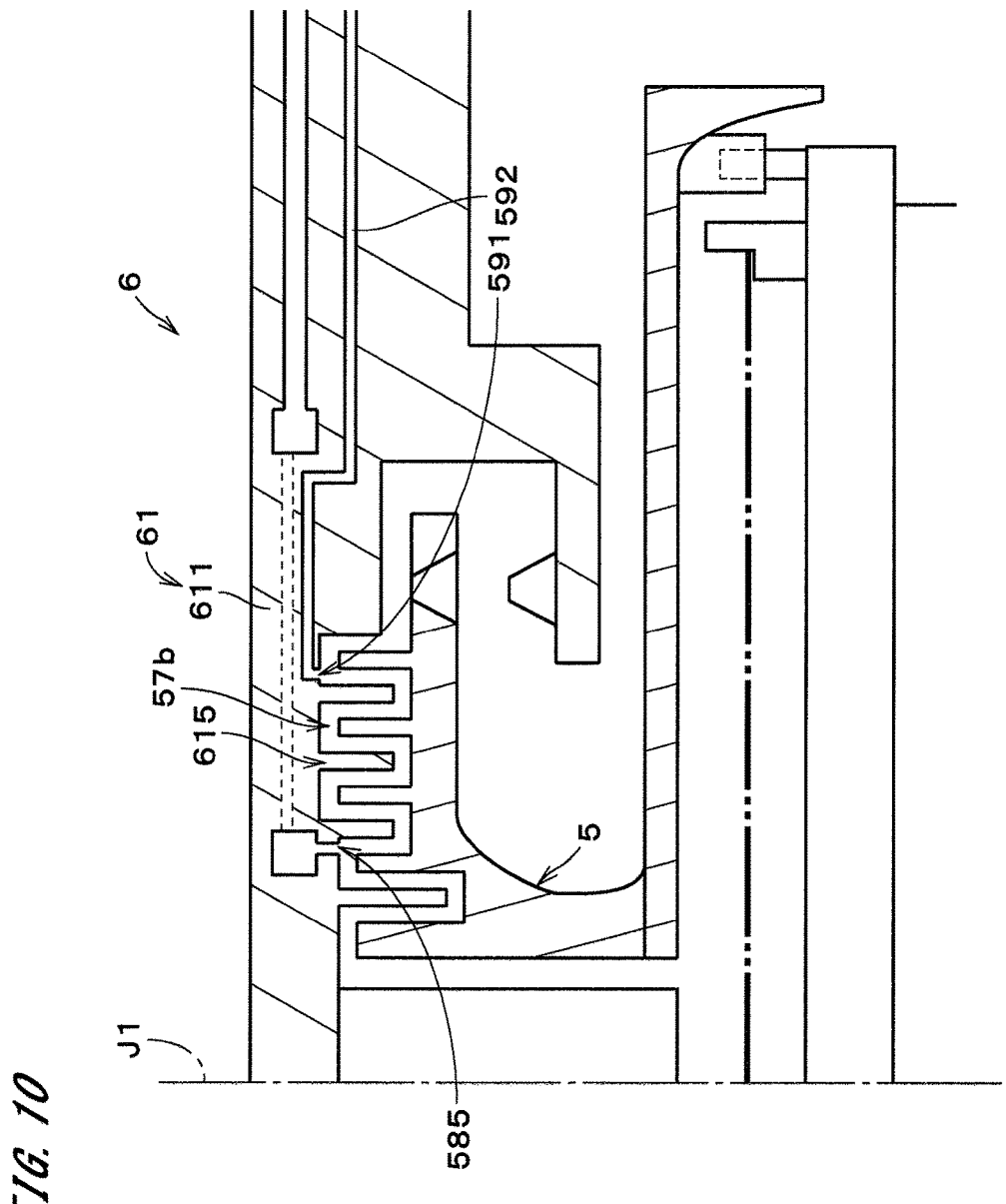
FIG. 10 is a cross-sectional view of another exemplary labyrinth.

Next, other exemplary labyrinths will be described. FIGS. 9 and 10, similarly to FIG. 3, are enlarged cross-sectional views of part of the top plate 5 and the opposing-member moving mechanism 6. In a labyrinth 57a illustrated in FIG. 9, a surface 553 that opposes the gas jet openings 585 (i.e., peripheral jet openings) is an inclined surface that is inclined downward outwardly in the radial direction. To be more specific, in the first uneven part 55 of the top plate 5, the radially outer side surface 553 of one annular raised portion 552 located below the gas jet openings 585 is an inclined surface that is inclined downward outwardly in the radial direction.

Thus, the seal gas jetted from the gas jet openings 585 into the labyrinth 57a can be readily guided radially outward along the side surface 553, which is an inclined surface. Consequently, the entry of the atmosphere of the external space into the labyrinth 57a is further suppressed. In addition, since the seal gas jetted from each gas jet opening 585 to the side surface 553 spreads in the peripheral direction, the seal gas can be supplied substantially uniformly to regions of the labyrinth 57a between the gas jet openings 585, Consequently, it is possible to improve uniformity of the pressure of the seal gas in the labyrinth 57a in the peripheral direction. Moreover, the uniformity of the flow rate of the seal gas in the labyrinth 57a in the peripheral direction can be further improved.

In the example illustrated in FIG. 10, the holder body 611 of the opposing-member holder 61 includes a plurality of gas suction ports 591 for sucking the gas in the labyrinth 57b, at the radially outer end of a labyrinth 57b (i.e., the end of the labyrinth on the above external space side). The gas suction ports 591 are circumferentially disposed at equiangular intervals in the upper surface of one recessed portion (i.e., the bottom surface of the recessed portion) located at the radially outer end of the second uneven part 615. The gas suction ports 591 are connected to a suction part (not shown) through a suction passage 592 that is formed inside the opposing-member holder 61. The gas suction ports 591 are peripheral suction ports that are circumferentially disposed about the central axis J1 at the radially outer end of the labyrinth 57b. By driving the suction part, the gas in the labyrinth 57b is sucked through the peripheral suction ports.

This configuration suppresses the entry of the atmosphere of the external space into the radially inner side of the gas suction ports 591 in the labyrinth 57b. Also, the seal gas supplied from the gas jet openings 585 into the labyrinth 57b can be more readily guided radially outward. Consequently, the entry of the atmosphere of the external space into the labyrinth 57b is further suppressed. The labyrinth 57b may, for example, include one generally annular suction port centered on the central axis J1 as a peripheral suction port, instead of the plurality of gas suction ports 591. The peripheral suction ports of the labyrinth 57b may be provided in the labyrinth 57a illustrated in FIG. 9.

Figure 11:
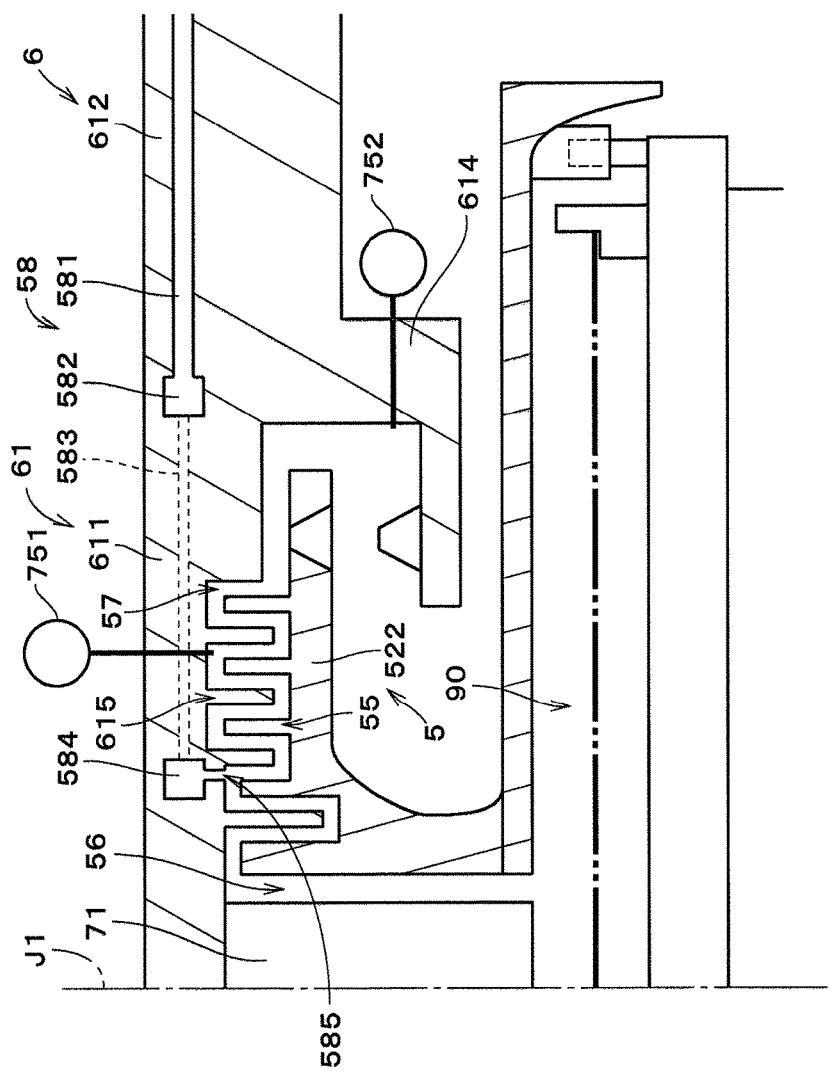
FIG. 11 is an enlarged cross-sectional view of part of the top plate and the opposing-member moving mechanism of another exemplary substrate processing apparatus.

Next, another exemplary substrate processing apparatus 1 will be described. FIG. 11 is an enlarged cross-sectional view of part of the top plate 5 and the opposing-member moving mechanism 6 of the substrate processing apparatus 1, and corresponds to FIG. 3 described above. The substrate processing apparatus 1 illustrated in FIG. 11 further includes a first pressure measuring part 751 and a second pressure measuring part 752, in addition to the constituent elements of the above-described substrate processing apparatus 1. The first pressure measuring part 751 measures the pressure in the labyrinth 57. The first pressure measuring part 751 may, for example, be a pressure gauge that is attached to the upper side of the holder body 611 of the opposing-member holder 61. The second pressure measuring part 752 measures the pressure in the external space (i.e., the outside space that is the space other than the nozzle gap 56 and the processing space 90 between the top plate 5 and the substrate 9). The second pressure measuring part 752 may, for example, be a pressure gauge that is attached to the radially outer side of the supporter connector 614 of the opposing-member holder 61.

Figure 12:
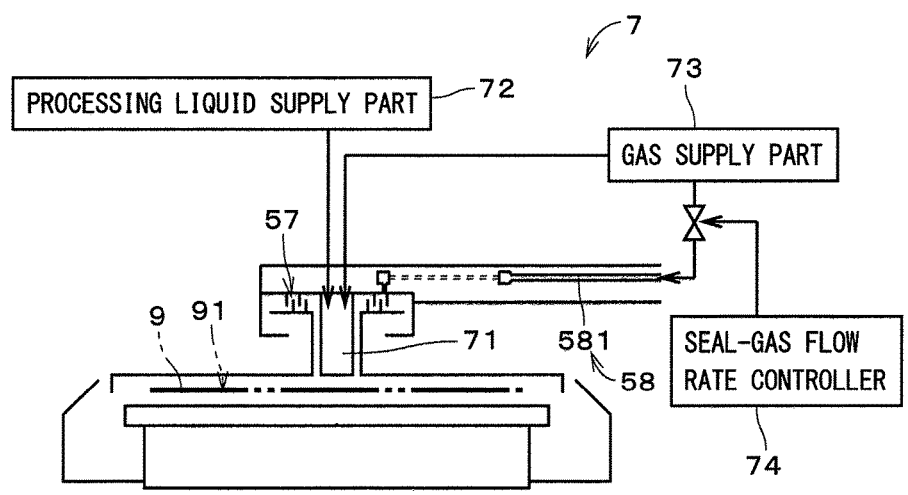
FIG. 12 is a block diagram of the gas-liquid supply part.

FIG. 12 is a block diagram of the gas-liquid supply part 7 that is related to the supply of gas and processing liquid in the substrate processing apparatus 1 illustrated in FIG. 11. The gas-liquid supply part 7 includes the processing liquid nozzle 71, the processing liquid supply part 72, the gas supply part 73, and a seal-gas flow rate controller 74. The processing liquid supply part 72 is connected to the processing liquid nozzle 71. The gas supply part 73 is connected to the processing liquid nozzle 71 and supplies a gas to the processing liquid nozzle 71. The gas supply part 73 is also connected to the first passage 581 of the gas supply passage 58 provided in the opposing-member holder 61 and supplies a gas through the gas supply passage 58 to the labyrinth 57.

The seal-gas flow rate controller 74 is provided between the gas supply part 73 and the labyrinth 57 and controls the flow rate of the gas supplied to the labyrinth 57 on the basis of a relative relationship between the pressure in the labyrinth 57 and the pressure in the external space. The seal-gas flow rate controller 74 controls the flow rate of the seal gas supplied to the labyrinth 57 by, for example, adjusting the degree of opening of a valve provided in the gas supply passage 58 that connects the gas supply part 73 and the labyrinth 57. The relative relationship between the pressure in the labyrinth 57 and the pressure in the external space is acquired on the basis of outputs of the first pressure measuring part 751 and the second pressure measuring part 752. For example, a difference between the pressure in the labyrinth 57, which is output from the first pressure measuring part 751, and the pressure in the external space, which is output from the second pressure measuring part 752, is acquired as the relative relationship.

Figure 7:
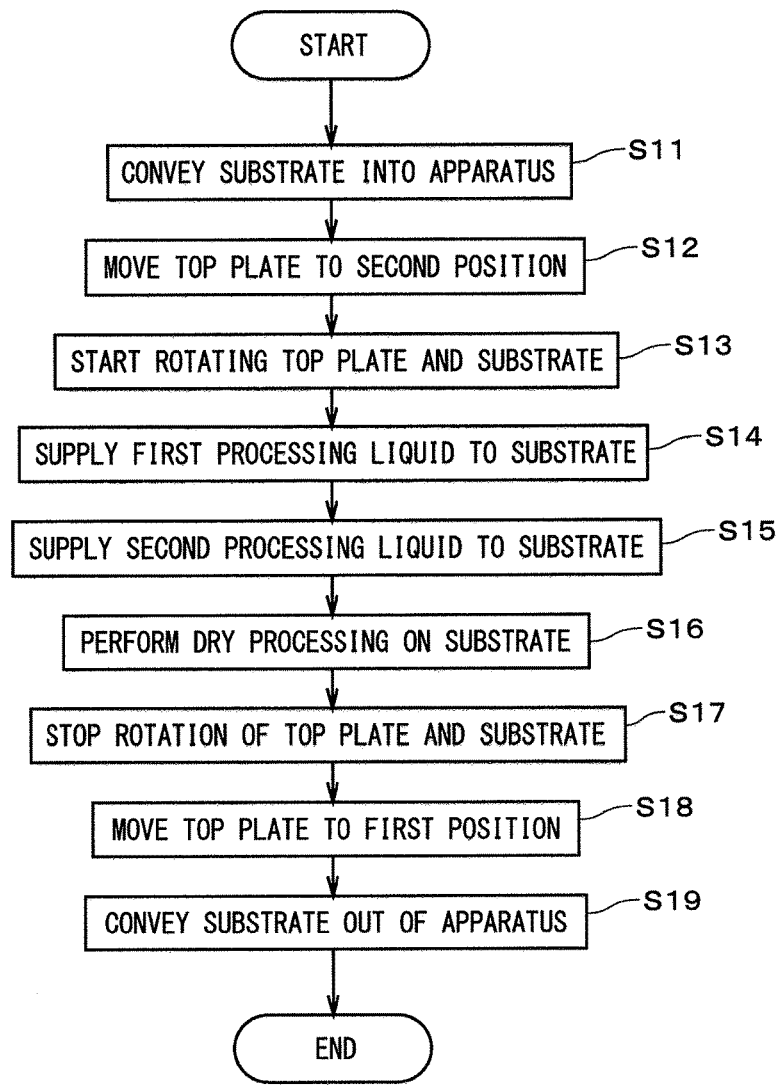
FIG. 7 is a flowchart of processing performed on a substrate.

The procedure of processing performed on the substrate 9 by the substrate processing apparatus 1 illustrated in FIG. 11 is approximately the same as the procedure illustrated in FIG. 7 described above. As described above, in the processing of the substrate 9 illustrated in FIG. 7, the flow rate of the treatment atmospheric gas jetted from the side surface of the processing liquid nozzle 71 toward the nozzle gap 56 increases between the cleaning processing of the substrate 9 in step S15 and the dry processing in step S16 (i.e., when the type of processing performed on the substrate 9 changes from the cleaning processing to the dry processing). This further reduces the pressure in the nozzle gap 56 (i.e., increases the negative pressure in the nozzle gap 56). Also, the rotation speed of the substrate 9 and the top plate 5 rotated by the substrate rotation mechanism 33 increases between steps S15 and S16. This further reduces the pressure in the central region of the processing space 90 (i.e., increases the negative pressure generated in the central region of the processing space 90).

In this way, the pressure in the nozzle gap 56 varies due to the increased flow rate of the treatment atmospheric gas and the increased rotation speed of the substrate 9 between steps S15 and S16, and these variations in pressure cause the relative relationship between the pressure in the labyrinth 57 and the pressure in the external space to vary. More specifically, the difference in pressure between the external space and the nozzle gap 56 increases, and this facilitates the entry of the atmosphere of the external space into the nozzle gap 56 through the labyrinth 57.

In view of this, in the substrate processing apparatus 1 illustrated in FIG. 11, the seal-gas flow rate controller 74 increases the flow rate of the seal gas supplied to the labyrinth 57 to improve the strength of the sealing in the labyrinth 57 when, for example, the pressure in the labyrinth 57 is lower by a predetermined pressure difference or more than the pressure in the external space. In this way, using the seal-gas flow rate controller 74 to control the flow rate of the seal gas supplied to the labyrinth 57 on the basis of the relative relationship between the pressure in the labyrinth 57 and the pressure in the external space suitably suppresses the entry of the atmosphere of the external space into the labyrinth 57. Consequently, it is possible to suitably suppress the entry of the atmosphere from the external space into the processing space 90.

In the substrate processing apparatus 1, the relative relationship between the pressure in the labyrinth 57 and the pressure in the external space is acquired on the basis of the outputs of the first pressure measuring part 751 and the second pressure measuring part 752 as described above. Thus, the relative relationship can be accurately acquired, and therefore the seal-gas flow rate controller 74 can accurately perform the seal-gas flow rate control based on the relative relationship. Consequently, the entry of the atmosphere from the external space into the processing space 90 can be suppressed more suitably.

In the substrate processing apparatus 1, the relative relationship between the pressure in the labyrinth 57 and the pressure in the external space does not necessarily have to be acquired on the basis of the outputs of the first pressure measuring part 751 and the second pressure measuring part 752. For example, the relative relationship may be acquired on the basis of the flow rate of the treatment atmospheric gas jetted toward the nozzle gap 56. More specifically, when the flow rate of the treatment atmospheric gas jetted toward the nozzle gap 56 is greater than or equal to a predetermined flow rate, the pressure in the labyrinth 57 may be determined to be lower by a predetermined pressure difference or more than the pressure in the external space. In this case, when the flow rate of the treatment atmospheric gas jetted toward the nozzle gap 56 varies, the seal-gas flow rate controller 74 controls the flow rate of the seal gas supplied to the labyrinth 57 on the basis of variations in the pressure in the nozzle gap 56 that are caused by the variations in the flow rate of the treatment atmospheric gas. This configuration can suitably suppress the entry of the atmosphere from the external space into the processing space 90.

Alternatively, the above relative relationship may be acquired on the basis of the rotation speed of the substrate 9, for example. More specifically, when the rotation speed of the substrate 9 is greater than or equal to a predetermined rotation speed, the pressure in the labyrinth 57 may be determined to be lower by a predetermined pressure difference or more than the pressure in the external space. In this case, when the rotation speed of the substrate 9 rotated by the substrate rotation mechanism 33 varies, the seal-gas flow rate controller 74 controls the flow rate of the seal gas supplied to the labyrinth 57 on the basis of variations in the pressure in the nozzle gap 56 that are caused by the variations in the rotation speed. This configuration can suitably suppress the entry of the atmosphere from the external space into the processing space 90.

As another alternative, the above relative relationship may be acquired on the basis of the type of processing performed on the substrate 9, for example. More specifically, when dry processing is performed on the substrate 9, the pressure in the labyrinth 57 may be determined to be lower by a predetermined pressure difference or more than the pressure in the external space. In this case, when the type of processing performed on the substrate 9 changes, the seal-gas flow rate controller 74 controls the flow rate of the seal gas supplied to the labyrinth 57 on the basis of variations in the pressure in the nozzle gap 56 that are caused by the change in the type of processing. This configuration can suitably suppress the entry of an atmosphere from the external space into the processing space 90.

In other words, in the substrate processing apparatus 1, the seal-gas flow rate control by the seal-gas flow rate controller 74 may be performed on the basis of variations (or changes) of one or two or more of the following: the flow rate of the treatment atmospheric gas jetted toward the nozzle gap 56, the rotation speed of the substrate 9 rotated by the substrate rotation mechanism 33, and the type of processing performed on the substrate 9. In this case, the first pressure measuring part 751 and the second pressure measuring part 752 may be omitted, or the seal-gas flow rate control based on the outputs of the first pressure measuring part 751 and the second pressure measuring part 752 may be used in combination.

Figure 13:
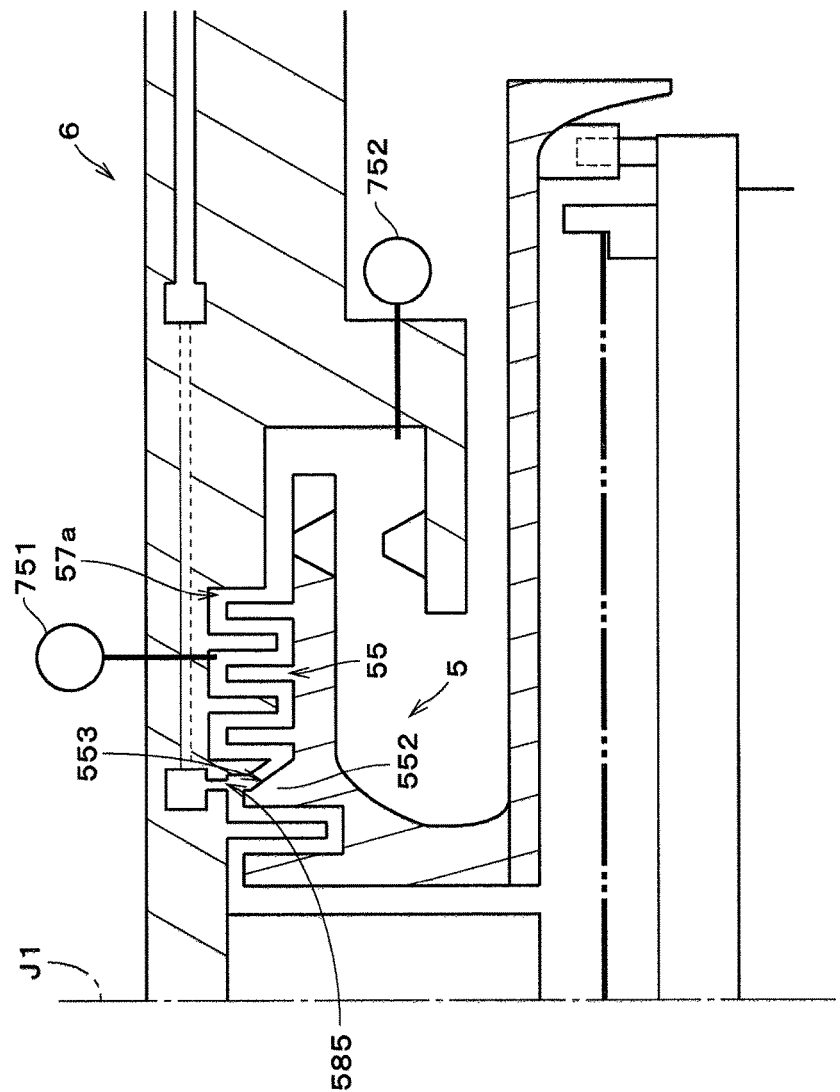
FIG. 13 is a cross-sectional view of another exemplary labyrinth.
Figure 14:
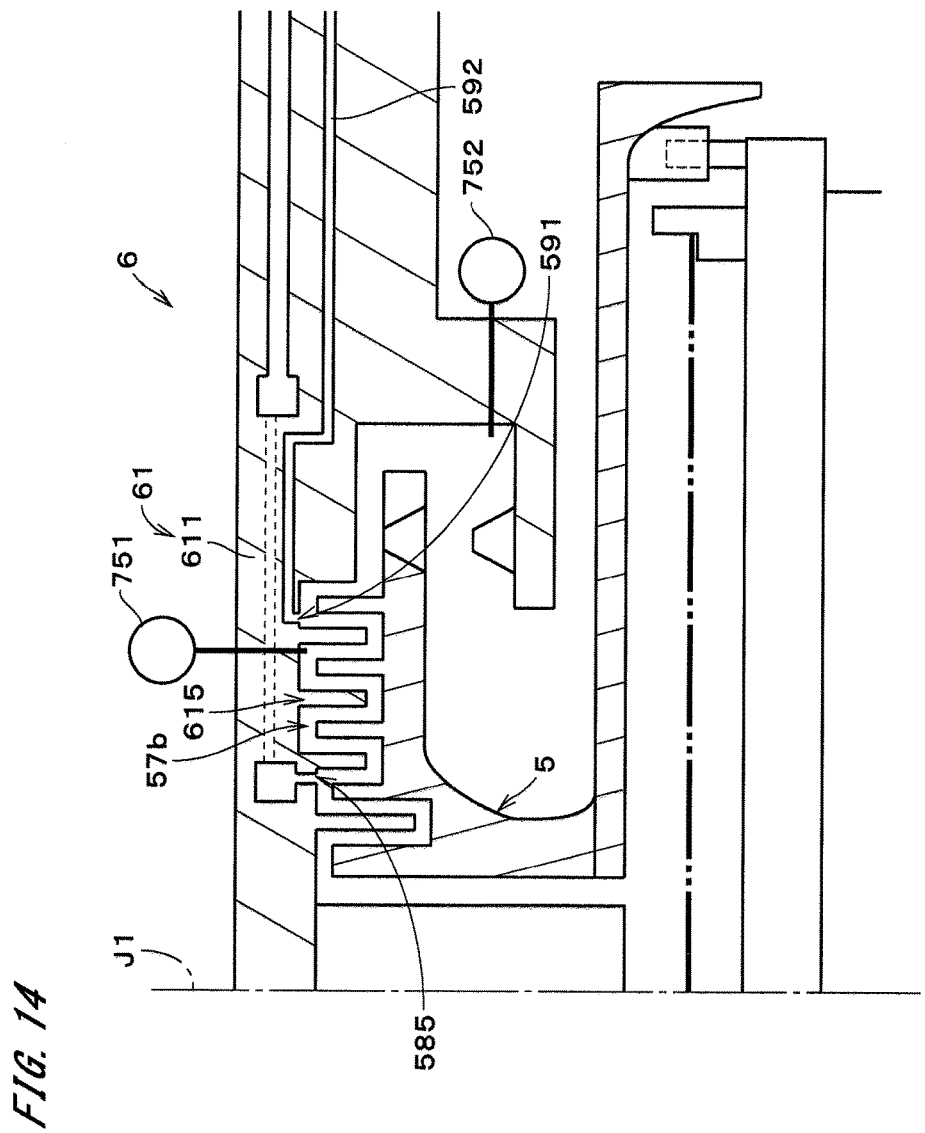
FIG. 14 is a cross-sectional view of another exemplary labyrinth.

As illustrated in FIGS. 13 and 14, the first pressure measuring part 751, the second pressure measuring part 752, and the seal-gas flow rate controller 74 (see FIG. 12) described above may also be provided in the labyrinths 57a and 57b illustrated in FIGS. 9 and 10.

The substrate processing apparatuses 1 described above may be modified in various ways.

For example, when the flow rate of the seal gas jetted from the gas jet openings 585 is approximately uniform in the peripheral direction, either one or both of the first manifold 582 and the second manifold 584 may be omitted.

The supply of the seal gas to the labyrinth 57 illustrated in FIG. 3 does not necessarily have to be conducted through the jet openings 585 (i.e., peripheral jet openings) provided in the holder body 611 of the opposing-member holder 61. For example, the supply of the seal gas to the labyrinth 57 may be conducted through non-peripheral jet openings provided in the holder body 611. Alternatively, the seal gas may be jetted from jet openings provided on the radially inner side of the labyrinth 57 (e.g., jet openings disposed at approximately the same position in the up-down direction as the position of the labyrinth 57 in the side surface of the processing liquid nozzle 71) toward the radially inner end of the labyrinth 57. The same applies to the labyrinths 57a and 57b illustrated in FIGS. 9 and 10.

The sucking of the gas at the radially outer end of the labyrinth 57b in FIG. 10 does not necessarily have to be conducted through the peripheral suction ports provided in the holder body 611 of the opposing-member holder 61. For example, ambient gas may be sucked through non-peripheral suction ports provided in the holder body 611 at the radially outer end of the labyrinth 57b.

In the substrate processing apparatus 1 illustrated in FIG. 1, the jetting of the treatment atmospheric gas from the side surface of the processing liquid nozzle 71 may be omitted.

The labyrinth 57 does not necessarily have to be formed by the first uneven part 55 of the opposing-member flange part 522 and the second uneven part 615 of the opposing-member holder 61. The shape and configuration of the labyrinth 57 may be changed in various ways. Also, the labyrinth 57 does not necessarily have to be formed in only the state in which the top plate 5 is located at the second position, and may be provided irrespective of the position of the top plate 5. The top plate 5 does not necessarily have to be held by the substrate holder 31 and rotated along with the substrate 9 by the substrate rotation mechanism 33, and may be rotated by another rotation mechanism independent of the substrate rotation mechanism 33. Also, the top plate 5 does not necessarily have to be rotated.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention. This application claims priority benefit wider 35 U.S.C. Section 119 of Japanese Patent Application No. 2015-120297 filed in the Japan Patent Office on Jun. 15, 2015 and Japanese Patent Application No. 2015-120298 filed in the Japan Patent Office on Jun. 15, 2015, the entire disclosures of which are incorporated herein by reference.

REFERENCE SIGNS LIST

1 Substrate processing apparatus
5 Top plate
6 Opposing-member moving mechanism
9 Substrate
31 Substrate holder
33 Substrate rotation mechanism
51 Opposing-member body
54 Opposing-member opening
55 First uneven part
56 Nozzle gap
57, 57a, 57b Labyrinth
71 Processing liquid nozzle
73 Gas supply part
74 Seal-gas flow rate controller
90 Processing space
91 Upper surface (of substrate)
521 Opposing-member tubular part
522 Opposing-member flange part
551 Recessed portion (of first uneven part)
553 Surface
582 First manifold
584 Second manifold
585 Gas jet opening
591 Gas suction port
611 Holder body
613 Flange supporter
615 Second uneven part
751 First pressure measuring part
752 Second pressure measuring part
J1 Central axis
S11 to S19 Step

The invention claimed is:
1. A substrate processing apparatus for processing a substrate, comprising:
 a substrate holder for holding a substrate in a horizontal position;
 an opposing member that opposes an upper surface of said substrate and has an opposing-member opening in a central part;
 an opposing-member moving mechanism for holding said opposing member and moving said opposing member relative to said substrate holder in an up-down direction between a first position and a second position that is below said first position;
 a substrate rotation mechanism for rotating said substrate along with said substrate holder about a central axis pointing in said up-down direction;
 a processing liquid nozzle for supplying a processing liquid to said upper surface of said substrate through said opposing-member opening; and a gas supply part for supplying a treatment atmospheric gas to a space between said opposing member and said substrate, wherein said opposing member includes:

an opposing-member body that opposes said upper surface of said substrate and has said opposing-member opening in the central part;

an opposing-member tubular part that has a tubular shape and protrudes upward from a periphery of said opposing-member opening of said opposing-member body and in which said processing liquid nozzle is inserted;

an opposing-member flange part that annularly extends radially outward from an upper end of said opposing-member tubular part and is held by said opposing-member moving mechanism; and a first uneven part in which a recessed portion and a raised portion are alternately disposed concentrically on an upper surface of said opposing-member flange part, said opposing-member moving mechanism includes:

a holder lower part that opposes a lower surface of said opposing-member flange part in said up-down direction;

a holder upper part that opposes said upper surface of said opposing-member flange part in said up-down direction; and a second uneven part in which a recessed portion and a raised portion are alternately disposed concentrically on a lower surface of said holder upper part, in a state in which said opposing member is located at said first position, said opposing-member flange part is supported from below by said holder lower part, and said opposing member is held by said opposing-member moving mechanism and spaced above said substrate holder, and in a state in which said opposing member is located at said second position, said opposing member is spaced from said opposing-member moving mechanism, is held by said substrate holder, and is rotatable along with said substrate holder by said substrate rotation mechanism, a labyrinth is formed as a result of the raised portion of one of said first uneven part and said second uneven part being disposed within the recessed portion of the other of said first uneven part and said second uneven part with a gap therebetween, and a seal gas is supplied to said labyrinth to seal a nozzle gap from a space located on the radially outer side of said labyrinth, said nozzle gap being a space between said processing liquid nozzle and said opposing-member tubular part.

2. The substrate processing apparatus according to claim 1, wherein said holder upper part includes a peripheral jet opening for jetting said seal gas toward said labyrinth, between radially inner and outer ends of said labyrinth.

3. The substrate processing apparatus according to claim 2, further comprising:

an annular manifold for temporarily storing said seal gas supplied from said seal gas supply part, between a seal gas supply part that is a supply source of said seal gas and said peripheral jet opening.

4. The substrate processing apparatus according to claim 2, wherein a surface of said labyrinth that opposes said peripheral jet opening is an inclined surface that is inclined downward outwardly in a radial direction.

5. The substrate processing apparatus according to claim 1, wherein said first uneven part includes a plurality of recessed portions, and a radially innermost recessed portion among said plurality of recessed portions is provided in an upper portion of said opposing-member tubular part and is larger than the other recessed portions in said up-down direction.

6. The substrate processing apparatus according to claim 1, wherein said holder upper part includes a peripheral suction port for sucking a gas that is in said labyrinth in a radially outer end of said labyrinth.

7. The substrate processing apparatus according to claim 1, wherein said gas supply part causes said treatment atmospheric gas to be jetted diagonally downward from a side surface of said processing liquid nozzle toward said nozzle gap.

8. A substrate processing apparatus for processing a substrate, comprising:

a substrate holder for holding a substrate in a horizontal position;

a substrate rotation mechanism for rotating said substrate along with said substrate holder about a central axis pointing in an up-down direction;

an opposing member including an opposing-member body that opposes an upper surface of said substrate and has an opposing-member opening in a central part, and an opposing-member tubular part that has a tubular shape and protrudes upward from a periphery of said opposing-member opening of said opposing-member body;

a processing liquid nozzle inserted in said opposing-member tubular part and for supplying a processing liquid to said upper surface of said substrate through said opposing-member opening;

a gas supply part for supplying a treatment atmospheric gas to a space between said opposing member and said substrate;

a labyrinth that is contiguous with a nozzle gap and seals said nozzle gap from an external space as a result of a seal gas being supplied thereto, said nozzle gap being a space between said processing liquid nozzle and said opposing-member tubular part; and a seal-gas flow rate controller for controlling a flow rate of said seal gas supplied to said labyrinth on the basis of a relative relationship between a pressure in said labyrinth and a pressure in said external space.

9. The substrate processing apparatus according to claim 8, wherein said relative relationship varies due to variations in pressure in said nozzle gap.

10. The substrate processing apparatus according to claim 9, wherein said gas supply part causes said treatment atmospheric gas to be jetted diagonally downward from a side surface of said processing liquid nozzle toward said nozzle gap, and in a case where a flow rate of said treatment atmospheric gas jetted toward said nozzle gap varies, said seal-gas flow rate controller controls the flow rate of said seal gas on the basis of said variations in pressure in said nozzle gap that are caused by the variations in the flow rate of said treatment atmospheric gas.

11. The substrate processing apparatus according to claim 9, wherein in a case where a rotation speed of said substrate rotated by said substrate rotation mechanism varies, said seal-gas flow rate controller controls the flow rate of said seal gas on the basis of said variations in pressure in said nozzle gap that are caused by the variations in said rotation speed.

12. The substrate processing apparatus according to claim 9, wherein
in a case where a type of processing performed on said substrate changes, said seal-gas flow rate controller controls the flow rate of said seal gas on the basis of said variations in pressure in said nozzle gap that are caused by the change in said type of processing.

13. The substrate processing apparatus according to claim 8, further comprising:
a first pressure measuring part for measuring the pressure in said labyrinth; and
a second pressure measuring part for measuring the pressure in said external space,
wherein said relative relationship is acquired on the basis of outputs of said first pressure measuring part and said second pressure measuring part.

14. The substrate processing apparatus according to claim 8, wherein
gas in said labyrinth is sucked at an end of said labyrinth on a side of said external space.

15. The substrate processing apparatus according to claim 8, further comprising:
an opposing-member moving mechanism for holding said opposing member and moving said opposing member relative to said substrate holder in an up-down direction between a first position and a second position that is below said first position,
wherein said opposing member further includes:
an opposing-member flange part that annularly extends radially outward from an upper end of said opposing-member tubular part and is held by said opposing-member moving mechanism; and
a first uneven part in which a recessed portion and a raised portion are alternately disposed concentrically on an upper surface of said opposing-member flange part,
said opposing-member moving mechanism includes:
a holder lower part that opposes a lower surface of said opposing-member flange part in said up-down direction;
a holder upper part that opposes said upper surface of said opposing-member flange part in said up-down direction; and
a second uneven part in which a recessed portion and a raised portion are alternately disposed concentrically on a lower surface of said holder upper part,
in a state in which said opposing member is located at said first position, said opposing-member flange part is supported from below by said holder lower part, and said opposing member is held by said opposing-member moving mechanism and spaced above said substrate holder, and
in a state in which said opposing member is located at said second position, said opposing member is spaced from said opposing-member moving mechanism, is held by said substrate holder, and is rotatable along with said substrate holder by said substrate rotation mechanism, and said labyrinth is formed as a result of the raised portion of one of said first uneven part and said second uneven part being disposed within the recessed portion of the other of said first uneven part and said second uneven part with a gap therebetween.

* * * * *